US012230572B2

(12) United States Patent
Huang et al.

(10) Patent No.: US 12,230,572 B2
(45) Date of Patent: Feb. 18, 2025

(54) BACKSIDE SIGNAL INTERCONNECTION

(71) Applicant: Taiwan Semiconductor Manufacturing Company, Ltd., Hsin-Chu (TW)

(72) Inventors: Yu-Xuan Huang, Hsinchu (TW); Ching-Wei Tsai, Hsinchu (TW); Yi-Hsun Chiu, Hsinchu County (TW); Yi-Bo Liao, Hsinchu (TW); Kuan-Lun Cheng, Hsin-Chu (TW); Wei-Cheng Lin, Taichung (TW); Wei-An Lai, Hsinchu (TW); Ming Chian Tsai, Hsinchu (TW); Jiann-Tyng Tzeng, Hsin Chu (TW); Hou-Yu Chen, Hsinchu County (TW); Chun-Yuan Chen, Hsinchu (TW); Huan-Chieh Su, Changhua County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/319,593

(22) Filed: May 18, 2023

(65) Prior Publication Data

US 2023/0307365 A1 Sep. 28, 2023

Related U.S. Application Data

(62) Division of application No. 17/196,174, filed on Mar. 9, 2021, now Pat. No. 11,658,119.
(Continued)

(51) Int. Cl.
*H01L 23/528* (2006.01)
*H01L 21/768* (2006.01)
(Continued)

(52) U.S. Cl.
CPC .... *H01L 23/5286* (2013.01); *H01L 21/76838* (2013.01); *H01L 23/5226* (2013.01);
(Continued)

(58) Field of Classification Search
CPC ............. H01L 23/5286; H01L 23/5226; H01L 23/535; H01L 21/76838; H01L 21/743;
(Continued)

(56) References Cited

U.S. PATENT DOCUMENTS 6,818,931 B2 * 11/2004 Liu .......................... H01L 21/84
257/276
8,772,109 B2 7/2014 Colinge
(Continued)

FOREIGN PATENT DOCUMENTS

KR 20190015269 A 2/2019
KR 20190036533 A 4/2019
(Continued)

OTHER PUBLICATIONS

Lou, Qiaowei, et al., "Optical Emission Spectroscopic Studies and Comparisons of CH3F/CO2 and CH3F/O2 Inductively Coupled Plasmas", Plasma Processing Laboratory, Department of Chemical and Biomolecular Engineering, University of Houston, Manuscript # JVSTA-A-14-332.
(Continued)

*Primary Examiner* — Dao H Nguyen
(74) *Attorney, Agent, or Firm* — HAYNES AND BOONE, LLP

(57) ABSTRACT

A semiconductor structure includes a first transistor having a first source/drain (S/D) feature and a first gate; a second transistor having a second S/D feature and a second gate; a multi-layer interconnection disposed over the first and the second transistors; a signal interconnection under the first and the second transistors; and a power rail under the signal
(Continued)

interconnection and electrically isolated from the signal interconnection, wherein the signal interconnection electrically connects one of the first S/D feature and the first gate to one of the second S/D feature and the second gate.

20 Claims, 32 Drawing Sheets

Related U.S. Application Data

(60) Provisional application No. 63/106,264, filed on Oct. 27, 2020.

(51) Int. Cl.
    *H01L 23/522* (2006.01)
    *H01L 27/088* (2006.01)
    *H01L 29/06* (2006.01)
    *H01L 29/78* (2006.01)

(52) U.S. Cl.
    CPC ........ *H01L 27/088* (2013.01); *H01L 29/0649* (2013.01); *H01L 29/78* (2013.01)

(58) Field of Classification Search
    CPC ....... H01L 21/823475; H01L 21/76224; H01L 21/76895; H01L 27/088; H01L 29/0649; H01L 29/78; H01L 29/0673; H01L 29/0847
    See application file for complete search history.

(56) References Cited

U.S. PATENT DOCUMENTS

| | | | |
|---|---|---|---|
| 8,785,285 B2 | 7/2014 | Tsai et al. | |
| 8,802,504 B1 | 8/2014 | Hou et al. | |
| 8,803,292 B2 | 8/2014 | Chen et al. | |
| 8,803,316 B2 | 8/2014 | Lin et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 8,993,380 B2 | 3/2015 | Hou et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,466,536 B2* | 10/2016 | Goktepeli | H01L 29/78648 |
| 9,478,507 B2* | 10/2016 | Stuber | H01L 23/5226 |
| 9,496,189 B2 | 11/2016 | Yu et al. | |
| 9,520,482 B1 | 12/2016 | Chang et al. | |
| 9,576,814 B2 | 2/2017 | Wu et al. | |
| 9,704,835 B2 | 7/2017 | Feng et al. | |
| 9,711,555 B2 | 7/2017 | Lin et al. | |
| 9,780,210 B1* | 10/2017 | Goktepeli | H01L 21/84 |
| 9,818,872 B2 | 11/2017 | Ching et al. | |
| 9,887,269 B2 | 2/2018 | Ching et al. | |
| 9,899,398 B1 | 2/2018 | Colinge et al. | |
| 10,020,261 B2 | 7/2018 | Wu et al. | |
| 10,032,627 B2 | 7/2018 | Lee et al. | |
| 10,109,721 B2 | 10/2018 | Lin et al. | |
| 10,157,799 B2 | 12/2018 | Ching et al. | |
| 10,199,502 B2 | 2/2019 | Huang et al. | |
| 10,269,715 B2 | 4/2019 | Wu et al. | |
| 10,282,504 B2 | 5/2019 | Wu et al. | |
| 10,607,938 B1* | 3/2020 | Rubin | H01L 21/823475 |
| 11,201,106 B2 | 12/2021 | Chen et al. | |
| 11,222,892 B2 | 1/2022 | Su et al. | |
| 11,233,005 B1 | 1/2022 | Chen et al. | |
| 11,342,413 B2 | 5/2022 | Huang et al. | |
| 11,355,601 B2 | 6/2022 | Chiang et al. | |
| 11,362,213 B2 | 6/2022 | Ju et al. | |
| 11,443,987 B2 | 9/2022 | Chen et al. | |
| 11,631,736 B2 | 4/2023 | Chu et al. | |
| 2008/0054313 A1* | 3/2008 | Dyer | H01L 21/76898 |
| | | | 257/E21.597 |
| 2012/0231620 A1* | 9/2012 | Kuroda | H10B 61/22 |
| | | | 438/586 |
| 2012/0280287 A1 | 11/2012 | Hou et al. | |
| 2018/0175036 A1 | 6/2018 | Ching et al. | |
| 2019/0164882 A1 | 5/2019 | Chen et al. | |
| 2021/0305130 A1* | 9/2021 | Cho | H01L 21/76895 |
| 2022/0271139 A1 | 8/2022 | Su et al. | |
| 2022/0352074 A1 | 11/2022 | Chen et al. | |
| 2022/0359700 A1 | 11/2022 | Chung et al. | |
| 2022/0367243 A1 | 11/2022 | Chang et al. | |
| 2022/0384589 A1 | 12/2022 | Su et al. | |

FOREIGN PATENT DOCUMENTS

| | | |
|---|---|---|
| KR | 20190072674 A | 6/2019 |
| TW | 202018554 A | 5/2020 |
| WO | 2018004653 A1 | 1/2018 |

OTHER PUBLICATIONS

Michallet, Jean-Eric, et al. "CoolCube: A True 3DVLSI Alternative to Scaling", Mar. 24, 2015, 3DInCities. https://www.3dincites.com/2015/03/coolcube-a-true-3dvlsi-alternative-to-scaling/.

* cited by examiner

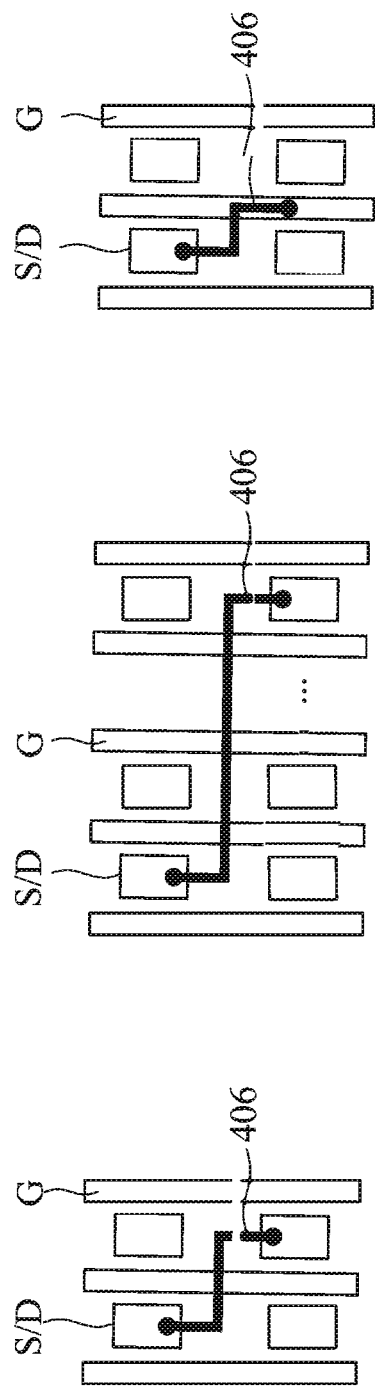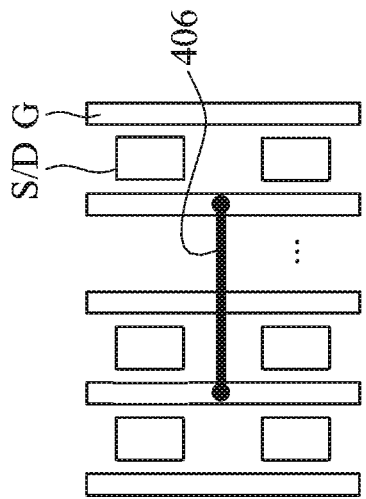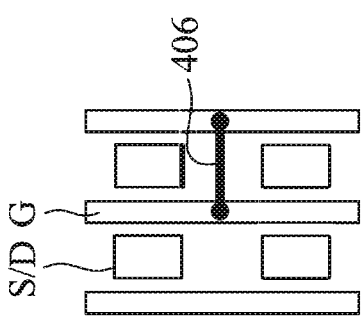
FIG. 16A
FIG. 16B
FIG. 16C
FIG. 16D
FIG. 16E

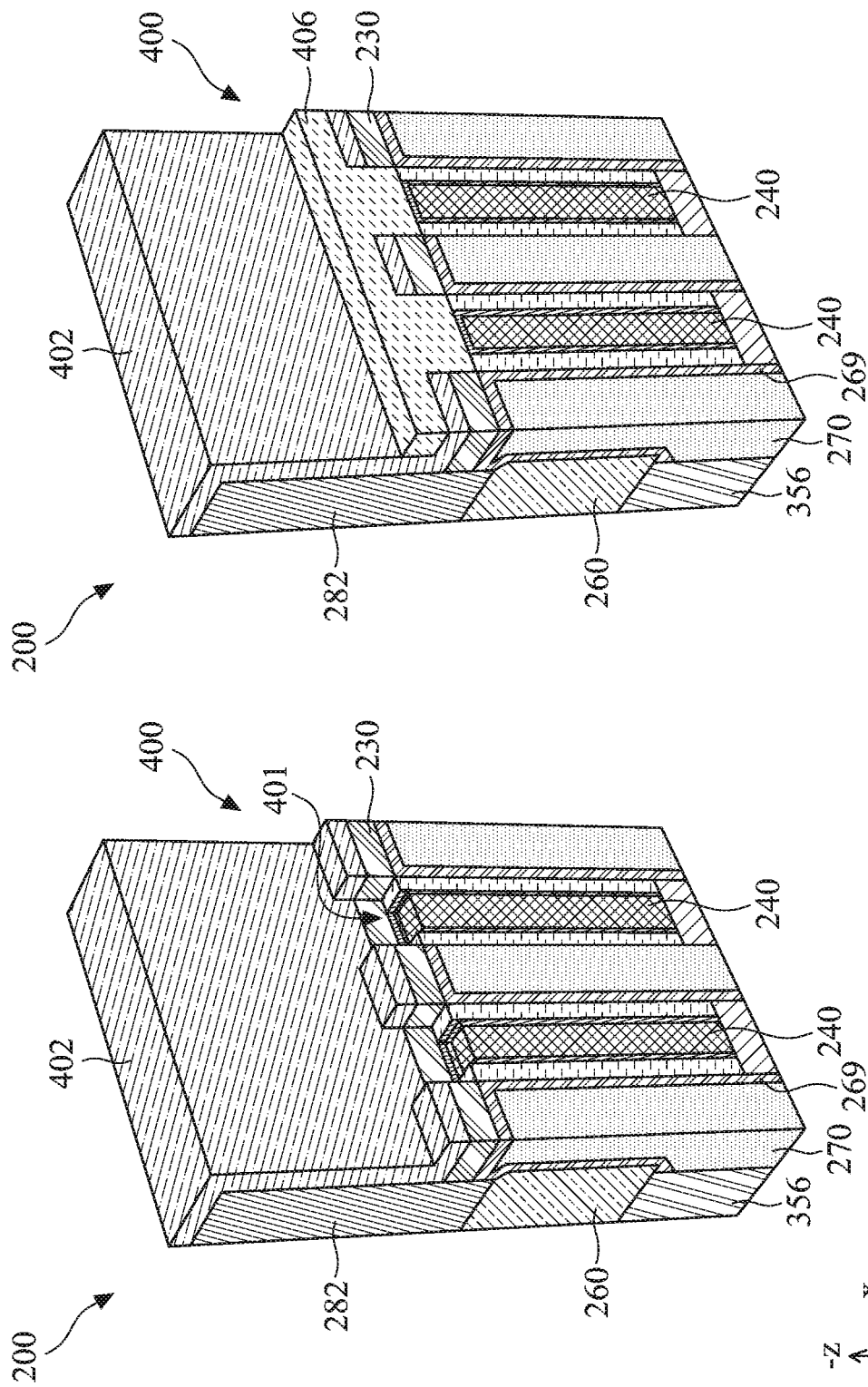

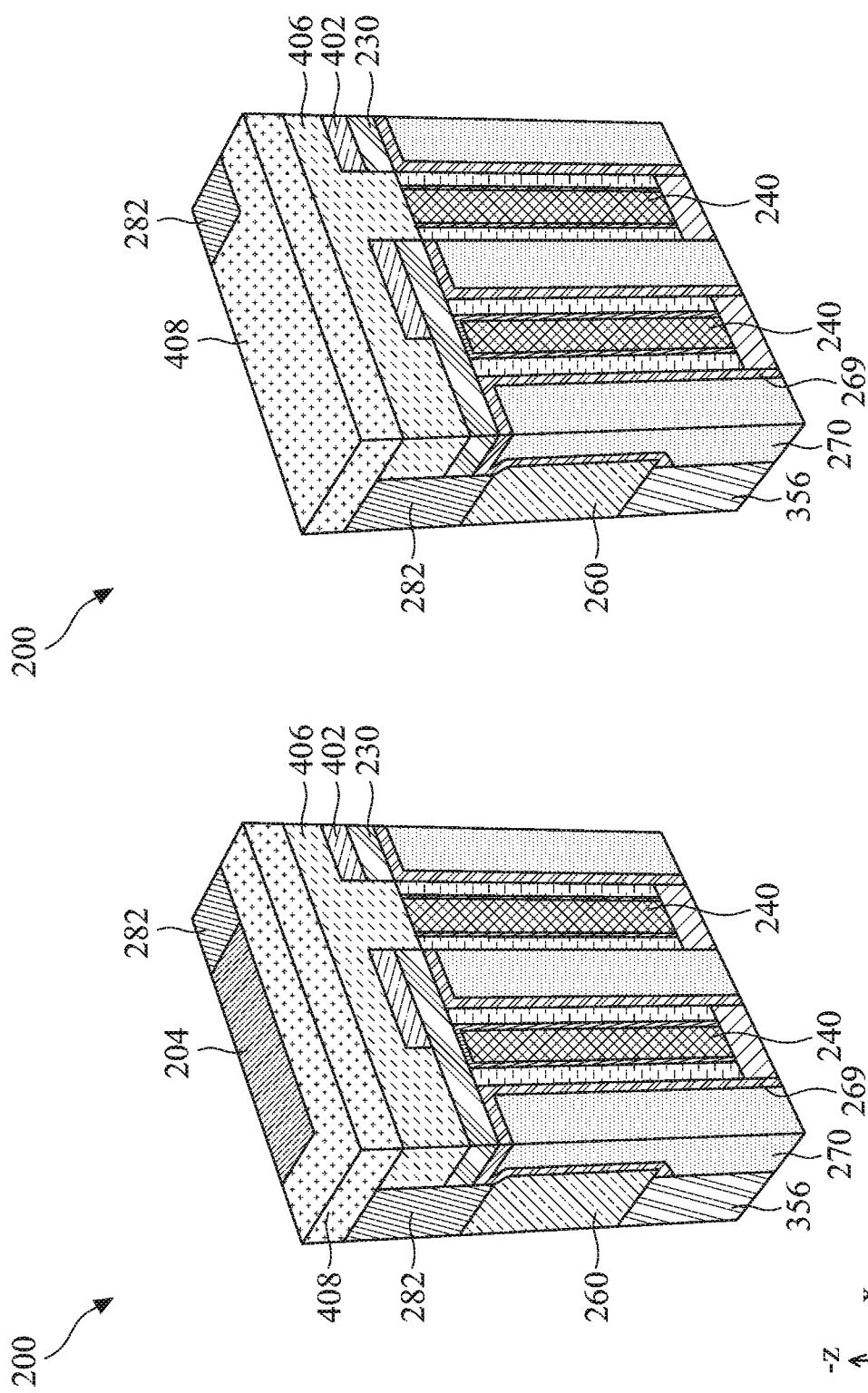

BACKSIDE SIGNAL INTERCONNECTION

PRIORITY

This is a divisional application of U.S. Application Ser. No. 17/196,174, filed Mar. 9, 2021, which claims the benefits of and priority to U.S. Provisional Application No. 63/106,264, filed Oct. 27, 2020, each of which is herein incorporated by reference in its entirety.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

For example, in standard cell designs, along with the reduction in IC feature size, the size (or footprint) of standard cells (such as Inverter, AND, OR, and NOR cells) are also shrunk in order to increase the circuit density. As a result, the area for signal interconnections (such as in M0, M1, M2 layers, etc.) per standard cell has been decreasing. This has created some adverse effects, such as congested routing, increased parasitic capacitance, and so on. Therefore, although existing approaches in semiconductor fabrication have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 16A, 16B, 16C, 16D, and 16E illustrate schematic layout views of a portion of the semiconductor device in FIG. 2A, according to some embodiments.

FIGS. 17A, 17B, 17C, 17D, 17E, 17F, 17G, 18A, 18B, 18C, 18D, 18E, 18F, 18G, and 18H illustrate perspective views of a portion of the semiconductor device in FIG. 2A, according to some embodiments.

DETAILED DESCRIPTION

Figure 1A:
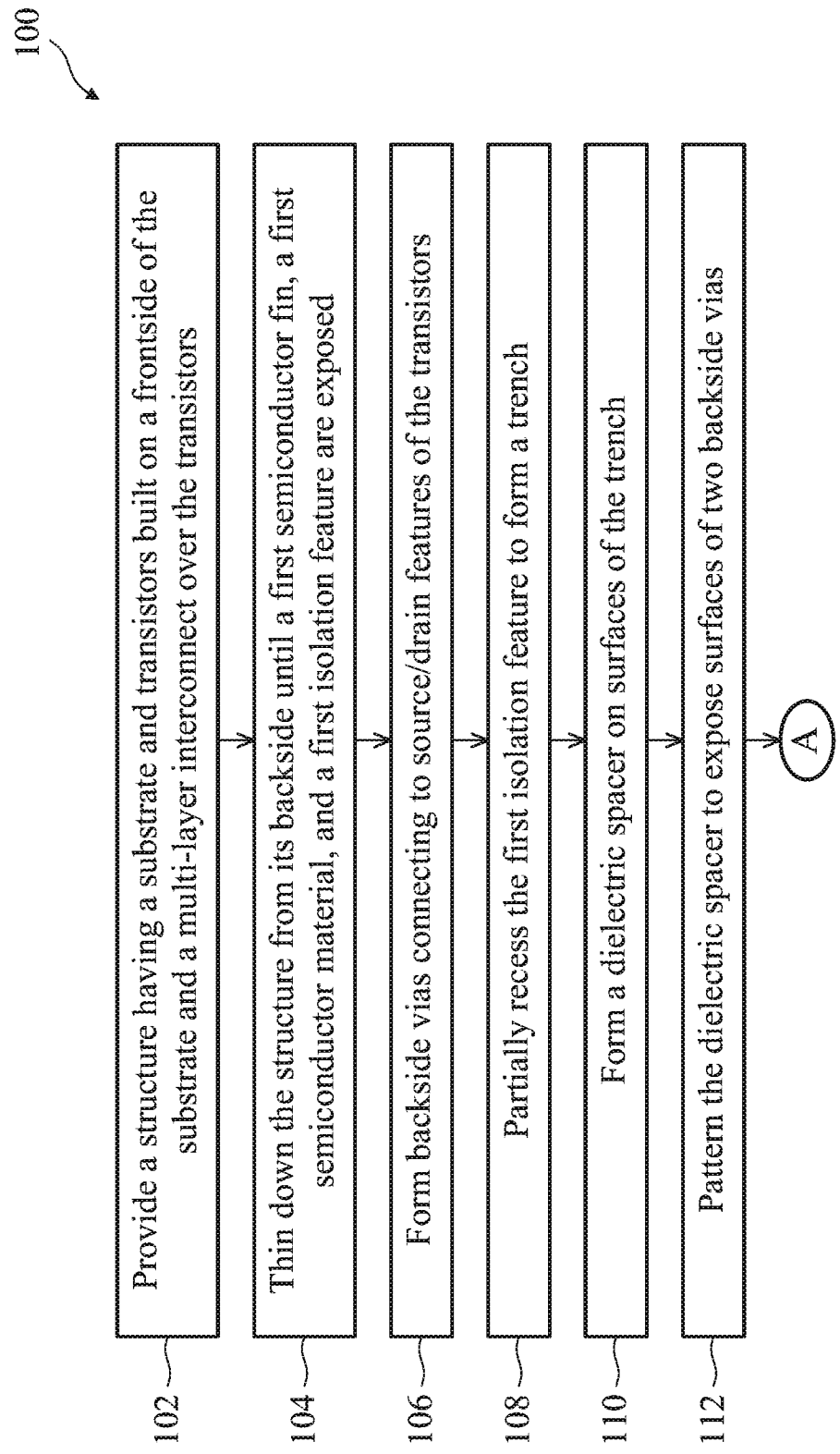
FIGS. 1A and 1B show a flow chart of a method of forming a semiconductor device with backside signal interconnections and backside power rails, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to semiconductor devices with backside signal interconnections and backside power rails. As discussed above, signal interconnections (or signal routing) has become more and more congested as the device downscaling continues. An object of the present disclosure includes providing signal interconnections on a back side (or backside) of a structure containing transistors in addition to an interconnect structure on a front side (or frontside) of the structure. The transistors can include gate-all-around (GAA) transistors, FinFET transistors, and/or other types of transistors. The backside signal interconnections can be made between a source/drain feature and another source/drain feature, between a source/drain feature and a gate, and between a gate and another gate. The structure is further provided with backside power rails (or power routings) below the backside signal interconnections in addition to power rails in the frontside interconnect structure. Thus, the structure is provided with increased number of signal routing tracks and power routing tracks for directly connecting to transistors' source/drain features and gates. Using the present disclosure, building blocks (such as standard cells) of ICs can be made smaller and circuit density of ICs can be made higher. The details of the structure and fabrication methods of the present disclosure are described below in conjunction with the accompanied drawings, which illustrate a process of making a GAA device, according to some embodiments. A GAA device refers to a device having vertically-stacked horizontally-oriented multi-channel transistors, such as nanowire transistors and nanosheet transistors. GAA devices are promising candidates to take CMOS to the next stage of the roadmap due to their better gate control ability, lower leakage current, and fully FinFET device layout compatibility. The present disclosure can also be utilized to make FinFET devices having backside signal interconnections and backside power rails. For purposes of simplicity, the present disclosure uses GAA devices as an example. Those of ordinary skill in the art should appreciate that they may readily use the present disclosure as a basis for designing or modifying other processes and structures, such as FinFET devices, for carrying out the same purposes and/or achieving the same advantages of the embodiments introduced herein.

Figure 1B:
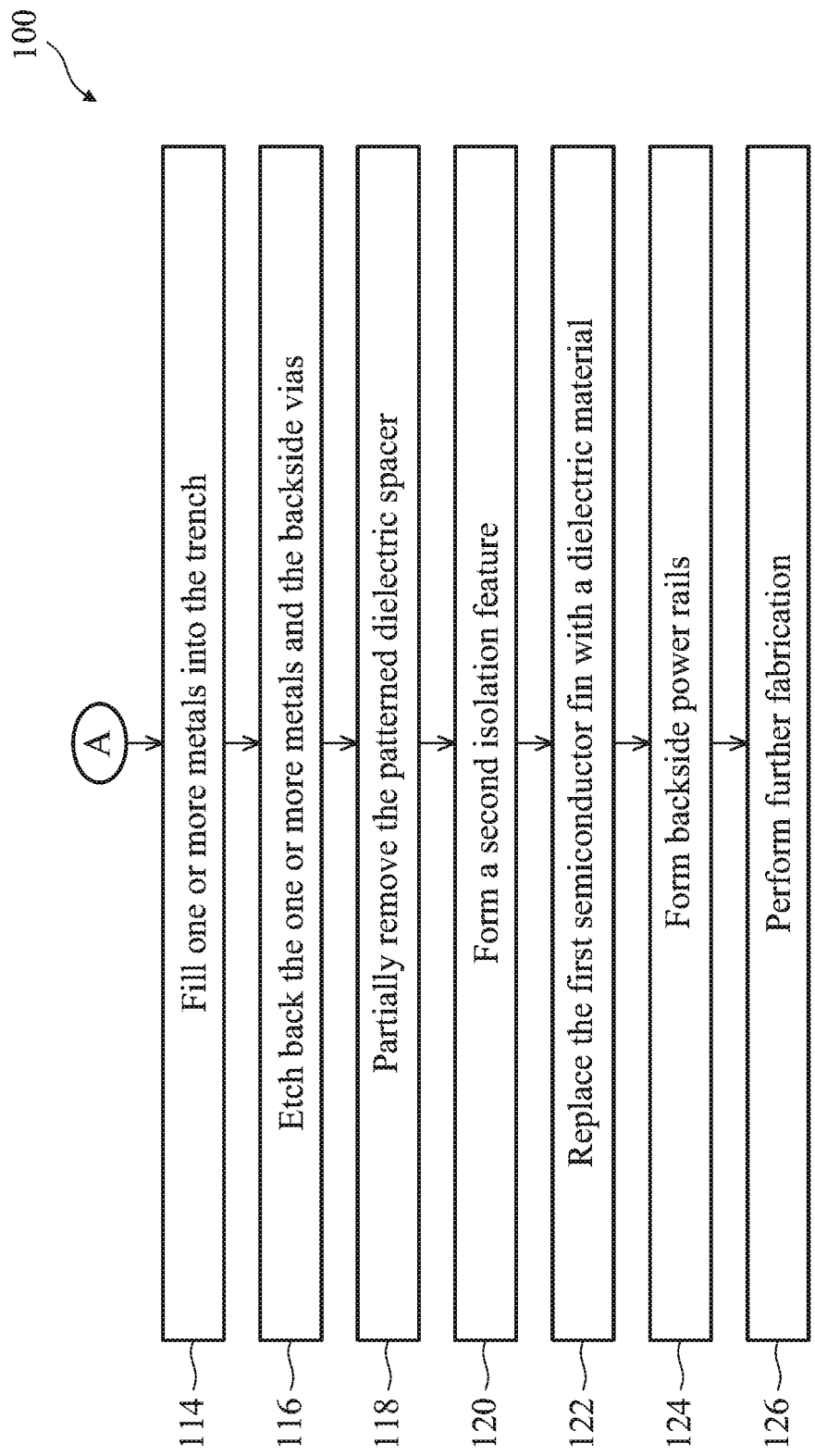

FIGS. 1A and 1B are a flow chart of a method 100 for fabricating a semiconductor device according to various aspects of the present disclosure. Additional processing is contemplated by the present disclosure. Additional operations can be provided before, during, and after method 100, and some of the operations described can be moved, replaced, or eliminated for additional embodiments of method 100.

Method 100 is described below in conjunction with FIG. 2A through FIG. 15 that illustrate various top, cross-sectional, and perspective views of a semiconductor device (or a semiconductor structure) 200 at various steps of fabrication according to the method 100, in accordance with some embodiments. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. FIGS. 2A through 15 have been simplified for the sake of clarity to better understand the inventive concepts of the present disclosure. Additional features can be added in the device 200, and some of the features described below can be replaced, modified, or eliminated in other embodiments of the device 200.

Figure 2B:
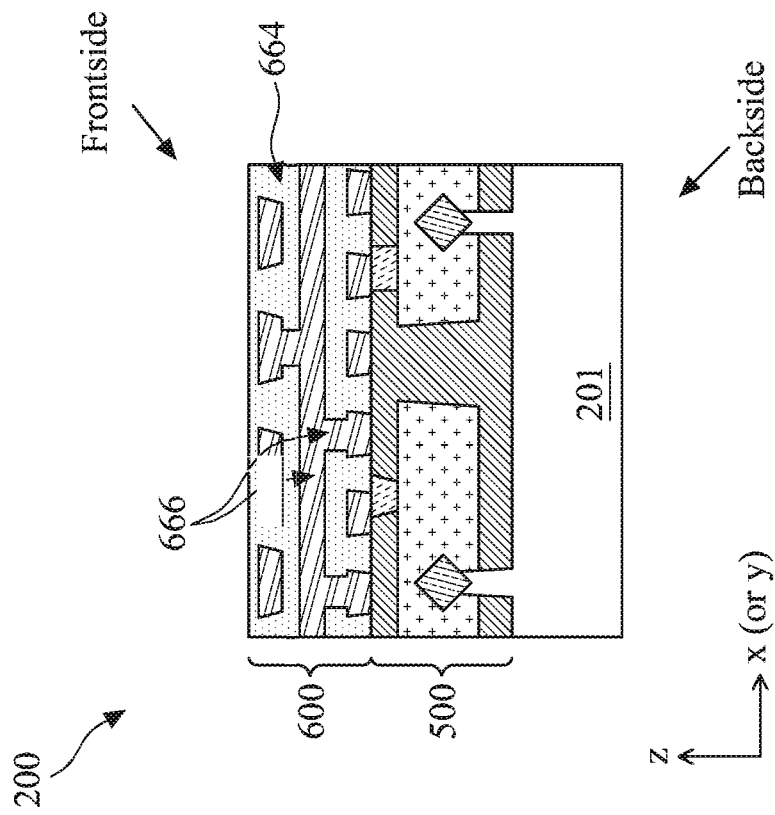
FIG. 2B illustrates a cross-sectional view of the semiconductor device in FIG. 2A.
Figure 2A:
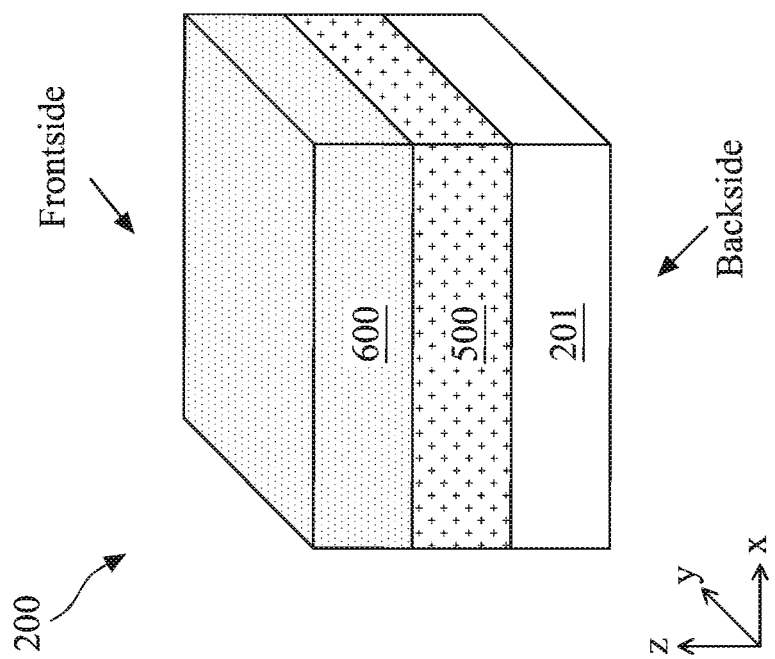
FIG. 2A illustrates a perspective view of a portion of a semiconductor device, according to some embodiments.

At operation 102, the method 100 (FIG. 1A) provides a semiconductor structure (or semiconductor device or device) 200 having a substrate 201, a device layer 500 over the frontside of the substrate 201, and an interconnect structure (or a multilayer interconnect) 600 over the device layer 500. The device layer 500 includes transistors. FIG. 2A illustrates a perspective view of the device 200, and FIG. 2B illustrates a cross-sectional view of the device 200, in portion. The device 200 may include other layers or features not shown in FIG. 2A, such as a passivation layer over the interconnect structure 600. The substrate 201 is at a backside of the device 200, and the interconnect structure 600 is at a frontside of device 200. In other words, the substrate 201, the device layer 500, and the interconnect structure 600 are disposed one over another from the backside to the frontside of the device 200.

The substrate 201 is a bulk silicon (Si) substrate in the present embodiment, such as a silicon wafer. In alternative embodiments, the substrate 201 includes other semiconductors such as germanium (Ge); a compound semiconductor such as silicon carbide (SiC), gallium arsenide (GaAs), indium arsenide (InAs), and indium phosphide (InP); or an alloy semiconductor, such as silicon germanium (SiGe), silicon germanium carbide (SiGeC), gallium arsenic phosphide (GaAsP), and gallium indium phosphide (GaInP). In some embodiments, the substrate 201 may include silicon on insulator (SOI) substrate, be strained and/or stressed for performance enhancement, include epitaxial regions, doped regions, and/or include other suitable features and layers.

The device layer 500 includes semiconductor active regions (such as semiconductor fins), and various active devices (e.g., transistors) built in or on the semiconductor active regions. The device layer 500 may also include passive devices such as capacitors, resistors, and inductors. The device layer 500 further includes local interconnects, isolation structures, and other structures.

The interconnect structure 600 is over the device layer 500 and includes conductors 666 (such as metal lines and vias) embedded in one or more dielectric layers 664. The conductors 666 provide connectivity to the devices in the device layer 500. The conductors 666 may also provide power rails and ground planes for the device 200. The conductors 666 may comprise copper, aluminum, or other suitable materials, and may be formed using single damascene process, dual damascene process, or other suitable processes. The dielectric layers 664 may comprise silicon nitride, silicon oxynitride, silicon nitride with oxygen (O) or carbon (C) elements, tetraethylorthosilicate (TEOS) formed oxide, un-doped silicate glass, or doped silicon oxide such as borophosphosilicate glass (BPSG), fluorosilicate glass (FSG), phosphosilicate glass (PSG), boron doped silicon glass (BSG), and/or other suitable dielectric materials.

Figure 2E:
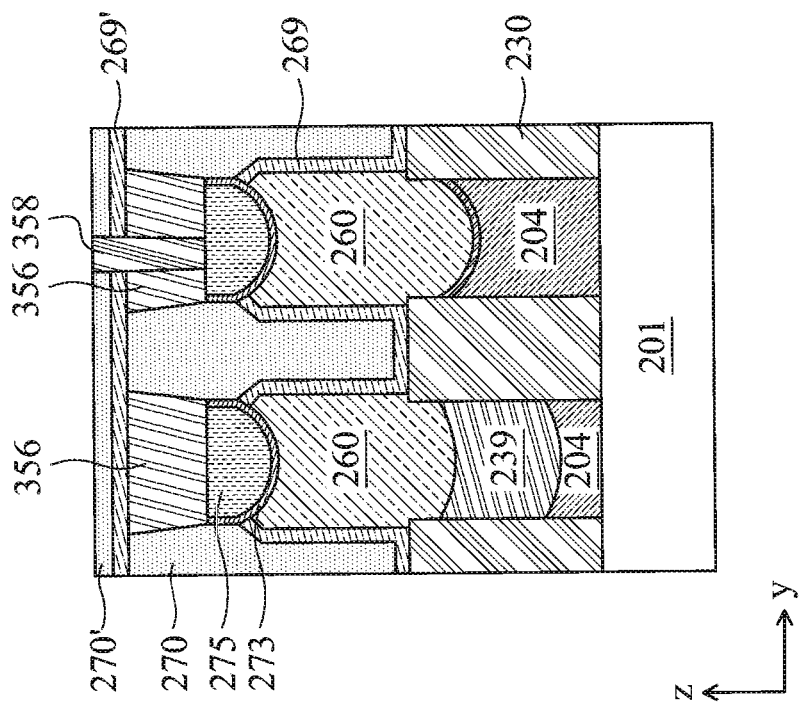
FIG. 2C illustrates a top view of a portion of the semiconductor device in FIG. 2A, and FIGS. 2D and 2E illustrate cross-sectional views of a portion of the semiconductor device of FIG. 2A along the D-D line and the E-E line in FIG. 2C, respectively, according to some embodiments.
Figure 2C:
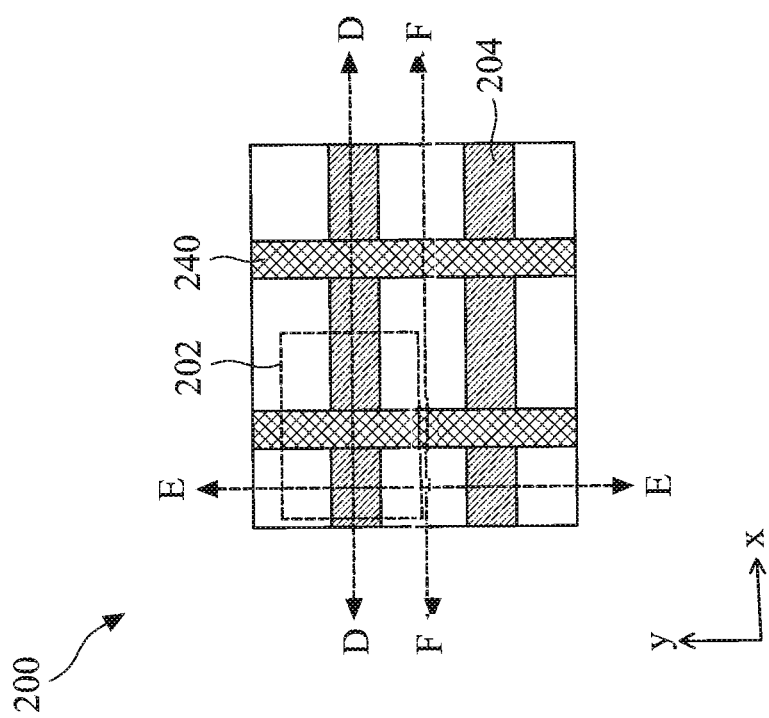
Figure 2D:
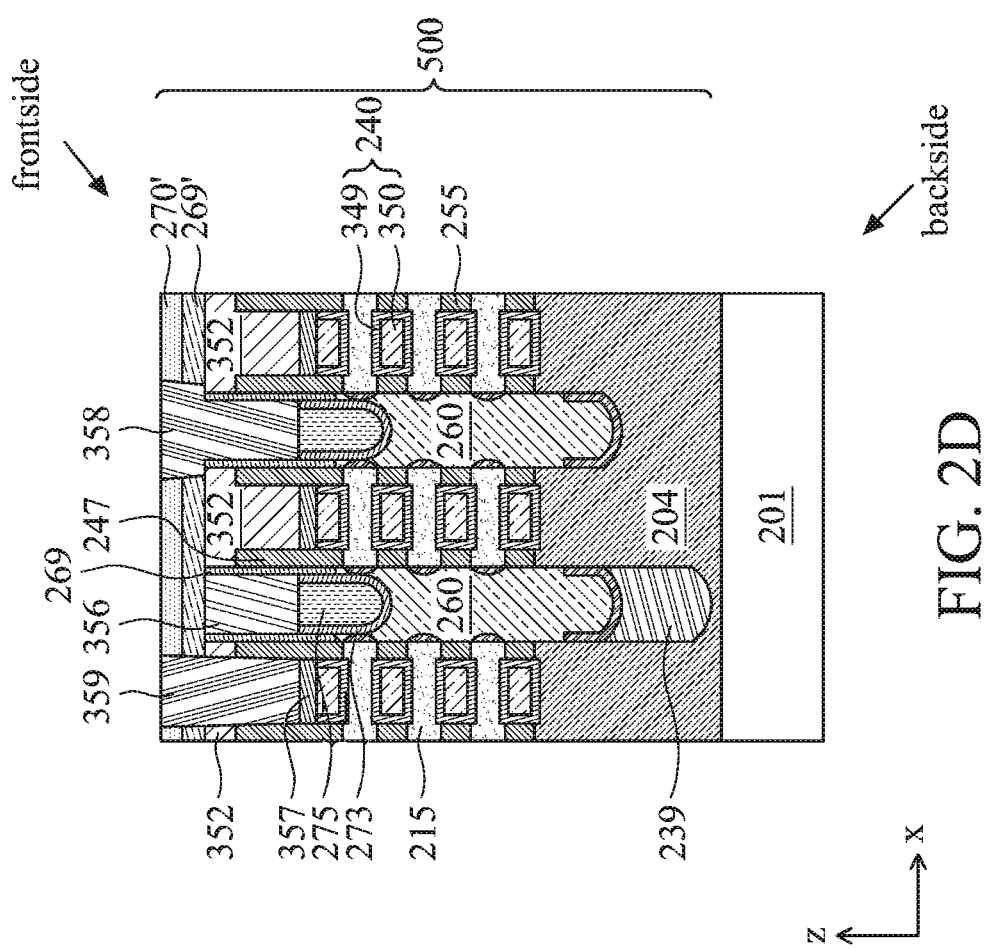

FIG. 2C shows a top view of a portion of the device 200, and FIGS. 2D and 2E show cross-sectional views of a portion of the device 200 along the D-D line and the E-E line in FIG. 2C, respectively. The device 200 includes gate stacks 240 oriented lengthwise along the "y" direction and active regions (such as semiconductor fins) 204 oriented lengthwise along the "x" direction. The example shown in FIG. 2C includes 4 transistors 202, each at an intersection of the gate stacks 240 and the semiconductor fins 204. As will be discussed, each transistor 202 includes two source/drain (S/D) features 260 on opposing sides of the respective gate stack 240 and one or more channel layer 215 connecting the two S/D features and engaged by the respective gate stack 240. FIGS. 2C, 2D, and 2E illustrate further details of the device layer 500. Particularly, the D-D line is cut along the lengthwise direction of a semiconductor fin 204 ("x" direction) and the E-E line is cut into the source/drain regions of the transistors and is parallel to the lengthwise direction of gate stacks 240 ("y" direction).

Referring to FIGS. 2C-2E, the semiconductor device 200 includes isolation features 230 (or isolation structure 230)

over the substrate 201, semiconductor fins 204 extending from the substrate 201 and adjacent to the isolation features 230, and source/drain (S/D) features 260 over the semiconductor fins 204 in the S/D regions. The semiconductor device 200 further includes one or more channel semiconductor layers (or channel layers) 215 suspended over the semiconductor fins 204 and connecting the S/D features 260 along the "x" direction, and gate stacks 240 between the S/D features 260 and wrapping around each of the channel layers 215. The semiconductor device 200 further includes inner spacers 255 between the S/D features 260 and the gate stack 240, an outer gate spacer 247 over sidewalls of the gate stack 240 and over the topmost channel layer 215, a contact etch stop layer (CESL) 269 adjacent to the gate spacer 247 and over the S/D features 260 and the isolation features 230, an inter-layer dielectric (ILD) layer 270 over the CESL 269, another CESL 269' over the ILD 270, and another ILD 270' over the CESL 269'. Over the gate stacks 240, the semiconductor device 200 further includes a self-aligned capping layer 352. In some implementations (like depicted in FIG. 2D), a glue layer 357 may be deposited over the gate stacks 240 and to improve adhesion between the gate stacks 240 and the gate vias 359 and to reduce contact resistance thereof. Over the S/D features 260, the semiconductor device 200 further includes silicide features 273, S/D contacts 275, dielectric S/D capping layer 356, and S/D contact via 358. In the depicted embodiment, the dielectric S/D capping layer 356 is disposed over some of the source/drain features 260, and the S/D contact via 358 is disposed over other source/drain features 260. The device 200 further includes a semiconductor layer 239 below some of the S/D features 260. In an embodiment, the semiconductor layer 239 includes a semiconductor material that is different from the semiconductor fin 204 and serves as a placeholder for backside via formation. In an embodiment where the device 200 is a FinFET device, the channel layers 215 are merged into one channel layer (a semiconductor fin channel), and the inner spacers 255 are omitted. Further, in such FinFET embodiment, the gate stack 240 engages top and sidewalls of the semiconductor fin channel, and in the cross-sectional view of FIG. 2D, the gate stack 240 would be on top of the semiconductor fin channel only. The various elements of the semiconductor device 200 are further described below.

In various embodiments, the semiconductor fins 204 may include silicon, silicon germanium, germanium, or other suitable semiconductor, and may be undoped, unintentionally doped, or slightly doped with n-type or p-type dopants. The fins 204 may be patterned by any suitable method. For example, the fins 204 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fins 204. For example, the masking element may be used for etching recesses into semiconductor layers over or in the substrate 201, leaving the fins 204 on the substrate 201. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 204 may be suitable.

The isolation features 230 may include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures and/or deep trench isolation (DTI) structures. In an embodiment, the isolation features 230 can be formed by filling the trenches between fins 204 with insulator material (for example, by using a CVD process or a spin-on glass process), performing a chemical mechanical polishing (CMP) process to remove excessive insulator material and/or planarize a top surface of the insulator material layer, and etching back the insulator material layer to form isolation features 230. In some embodiments, isolation features 230 include a multi-layer structure, such as a silicon nitride layer disposed over a thermal oxide liner layer.

The semiconductor layer 239 may be deposited using an epitaxial growth process or by other suitable processes. In some embodiments, epitaxial growth of semiconductor layers 239 is achieved by a molecular beam epitaxy (MBE) process, a chemical vapor deposition (CVD) process, a metalorganic chemical vapor deposition (MOCVD) process, other suitable epitaxial growth process, or combinations thereof. The semiconductor layer 239 includes a semiconductor material that is different than the semiconductor material included in the semiconductor fins 204 to achieve etching selectivity during subsequent processing. For example, semiconductor layer 239 and semiconductor fins 204 may include different materials, different constituent atomic percentages, different constituent weight percentages, and/or other characteristics to achieve desired etching selectivity during an etching process. In an embodiment, the semiconductor fins 204 includes silicon and the semiconductor layer 239 includes silicon germanium. In another embodiment, semiconductor layer 239 and semiconductor fins 204 can both include silicon germanium, but with different silicon atomic percent. The present disclosure contemplates that semiconductor layer 239 and semiconductor fins 204 include any combination of semiconductor materials that can provide desired etching selectivity, including any of the semiconductor materials disclosed herein. The semiconductor layer 239 serves as a placeholder for backside vias and/or backside isolation.

The S/D features 260 include epitaxially grown semiconductor materials such as epitaxially grown silicon, germanium, or silicon germanium. The S/D features 260 can be formed by any epitaxy processes including chemical vapor deposition (CVD) techniques, molecular beam epitaxy, other suitable epitaxial growth processes, or combinations thereof. The S/D features 260 may be doped with n-type dopants and/or p-type dopants. In some embodiments, for n-type transistors 202, the S/D features 260 include silicon and can be doped with carbon, phosphorous, arsenic, other n-type dopant, or combinations thereof (for example, forming Si:C epitaxial S/D features, Si:P epitaxial S/D features, or Si:C:P epitaxial S/D features). In some embodiments, for p-type transistors 202, the S/D features 260 include silicon germanium or germanium, and can be doped with boron, other p-type dopant, or combinations thereof (for example, forming Si:Ge:B epitaxial S/D features). The S/D features 260 may include multiple epitaxial semiconductor layers having different levels of dopant density. In some embodiments, annealing processes (e.g., rapid thermal annealing (RTA) and/or laser annealing) are performed to activate dopants in the epitaxial S/D features 260.

In embodiments, the channel layers 215 includes a semiconductor material suitable for transistor channels, such as silicon, silicon germanium, or other semiconductor material(s). The channel layers 215 may be in the shape of rods, bars, sheets, or other shapes in various embodiments. In an embodiment, the channel layers 215 are initially part of a stack of semiconductor layers that include the channel layers 215 and other (sacrificial) semiconductor layers alternately stacked layer-by-layer. The sacrificial semiconductor layers and the channel layers 215 include different material compositions (such as different semiconductor materials, different constituent atomic percentages, and/or different constituent weight percentages) to achieve etching selectivity. During a gate replacement process to form the gate stack 240, the sacrificial semiconductor layers are removed, leaving the channel layers 215 suspended over the semiconductor fins 204.

In some embodiments, the inner spacer layer 255 includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the inner spacer layer 255 includes a low-k dielectric material, such as those described herein. The inner spacer layer 255 may be formed by deposition and etching processes. For example, after S/D trenches are etched and before the S/D features 260 are epitaxially grown from the S/D trenches, an etch process may be used to recess the sacrificial semiconductor layers between the adjacent channel layers 215 to form gaps vertically between the adjacent channel layers 215. Then, one or more dielectric materials are deposited (using CVD or ALD for example) to fill the gaps. Another etching process is performed to remove the dielectric materials outside the gaps, thereby forming the inner spacer layer 255.

In the depicted embodiment, each gate stack 240 includes a gate dielectric layer 349 and a gate electrode 350. The gate dielectric layer 349 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), (Ba,Sr)$TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The gate dielectric layer 349 may be formed by chemical oxidation, thermal oxidation, atomic layer deposition (ALD), chemical vapor deposition (CVD), and/or other suitable methods. In some embodiments, the gate stack 240 further includes an interfacial layer between the gate dielectric layer 349 and the channel layers 215. The interfacial layer may include silicon dioxide, silicon oxynitride, or other suitable materials. In some embodiments, the gate electrode layer 350 includes an n-type or a p-type work function layer and a metal fill layer.

For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer 350 may be formed by CVD, PVD, plating, and/or other suitable processes. Since the gate stack 240 includes a high-k dielectric layer and metal layer(s), it is also referred to as a high-k metal gate.

In an embodiment, the gate spacer 247 includes a dielectric material such as a dielectric material including silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In embodiments, the gate spacer 247 may include $La_2O_3$, $Al_2O_3$, ZnO, ZrN, $Zr_2Al_3O_9$, $TiO_2$, $TaO_2$, $ZrO_2$, $HfO_2$, $Y_2O_3$, AlON, TaCN, ZrSi, or other suitable material(s). For example, a dielectric layer including silicon and nitrogen, such as a silicon nitride layer, can be deposited over a dummy gate stack (which is subsequently replaced by the high-k metal gate stack 240) and subsequently etched (e.g., anisotropically etched) to form gate spacers 247. In some embodiments, gate spacers 247 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to the gate stack 240. In embodiments, the gate spacer 247 may have a thickness of about 1 nm to about 40 nm, for example.

In some embodiments, the SAC layer 352 includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). The SAC layer 352 protects the gate stacks 240 from etching and CMP processes that are used for etching S/D contact holes. The SAC layer 352 may be formed by recessing the gate stacks 240 and optionally recessing the gate spacers 247, depositing one or more dielectric materials over the recessed gate stacks 240 and optionally over the recessed gate spacers 247, and performing a CMP process to the one or more dielectric materials.

In embodiments, the CESLs 269 and 269' may each include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layers 270 and 270' may each comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD layers 270 and 270' may each be formed by PECVD (plasma enhanced CVD), FCVD (flowable CVD), or other suitable methods.

In some embodiments, the silicide features 273 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

In an embodiment, the S/D contacts 275 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD. PVD. ALD, and/or other suitable processes. The metal fill layer may include tungsten (W), cobalt (Co), molybdenum (Mo), ruthenium (Ru), nickel (Ni), copper (Cu), or other metals, and may be formed by CVD. PVD, ALD, plating, or other suitable processes. In some embodiments, the conductive barrier layer is omitted in the S/D contacts 275.

In some embodiments, the capping layer 356 includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). The capping layer 356 protects the S/D contacts 275 from etching and CMP processes and isolating the S/D contacts 275 from the interconnect structure formed thereon. In some embodiments, the SAC layer 352 and the capping layer 356 include different materials to achieve etch selectivity, for example, during the formation of the capping layer 356.

In an embodiment, the S/D contact vias 358 and the gate vias 359 may each include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD. ALD, and/or other suitable processes. The metal fill layer may include tungsten (W), cobalt (Co), molybdenum (Mo), ruthenium (Ru), nickel (Ni), copper (Cu), or other metals, and may be formed by CVD, PVD. ALD, plating, or other suitable processes. In some embodiments, the conductive barrier layer is omitted in the S/D contact vias 358 and/or the gate vias 359. In some embodiments, the glue layer 357 may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD.

Figure 3:
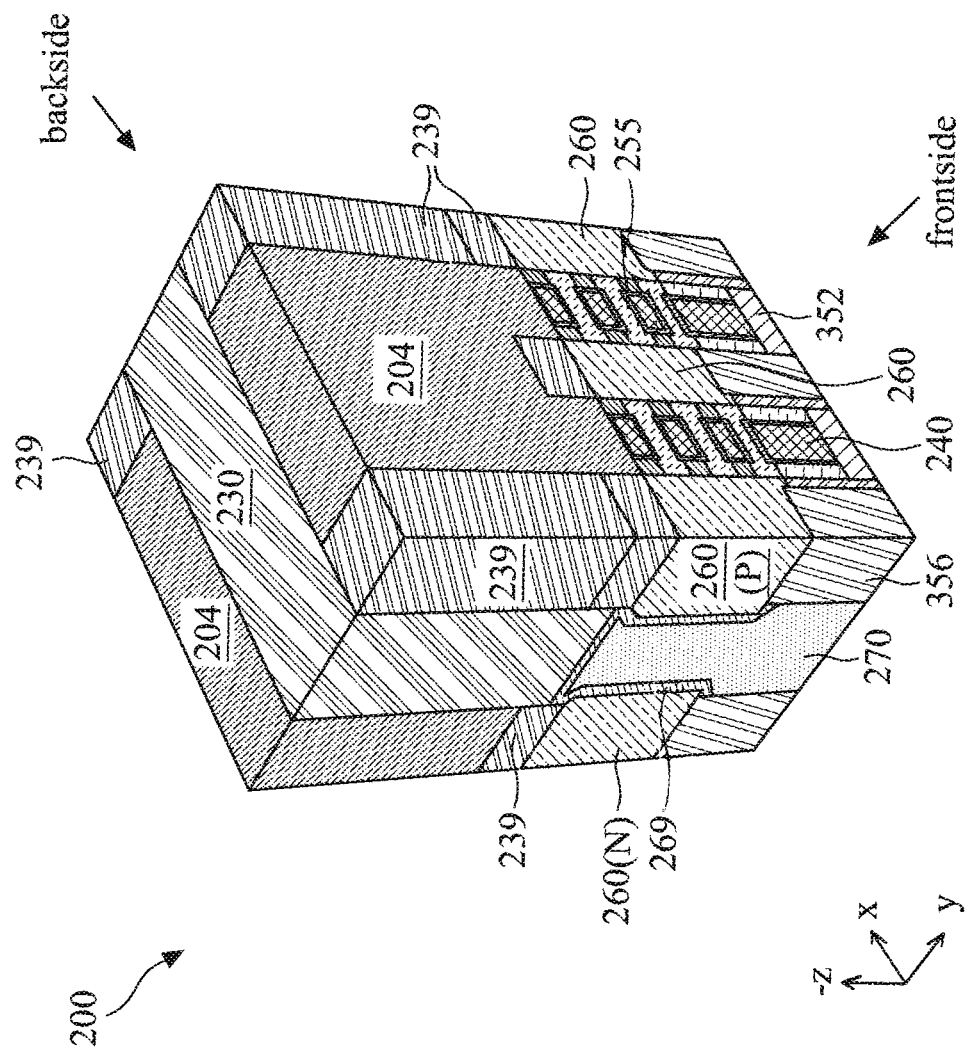
FIGS. 3, 4, 5, 6, 7, 8A, 9, 10, 11A, 12, 13, 14, and 15 illustrate perspective views of a portion of the semiconductor device in FIG. 2A, according to some embodiments.

At operation 104, the method 100 (FIG. 1A) thins down the device 200 from its backside until the semiconductor fins 204, the semiconductor layer 239, and the isolation features 230 are exposed from the backside of the device 200. The resultant structure is shown in FIG. 3 according to an embodiment. For simplicity, some of the features of the device 200 are not shown in FIG. 3. It is noted that the device 200 is flipped upside down in FIG. 3, as well as in FIGS. 4-15 and 17A-18H, which is indicated with the "–z" axis pointing up. Further, in the embodiment depicted in FIG. 3, some of the S/D features 260 are n-type (labeled with 260(N)) and for n-type transistors 202, and some of the S/D features 260 are p-type (labeled with 260(P)) and for p-type transistors 202. In an embodiment, the operation 104 first flips the device 200 upside down and attaches the frontside of the device 200 to a carrier, and then applies a thinning process to the backside of the device 200. The thinning process may include a mechanical grinding process and/or a chemical thinning process. A substantial amount of substrate material may be first removed from the substrate 201 during a mechanical grinding process. Afterwards, a chemical thinning process may apply an etching chemical to the backside of the substrate 201 to further thin down the substrate 201.

Figure 4:
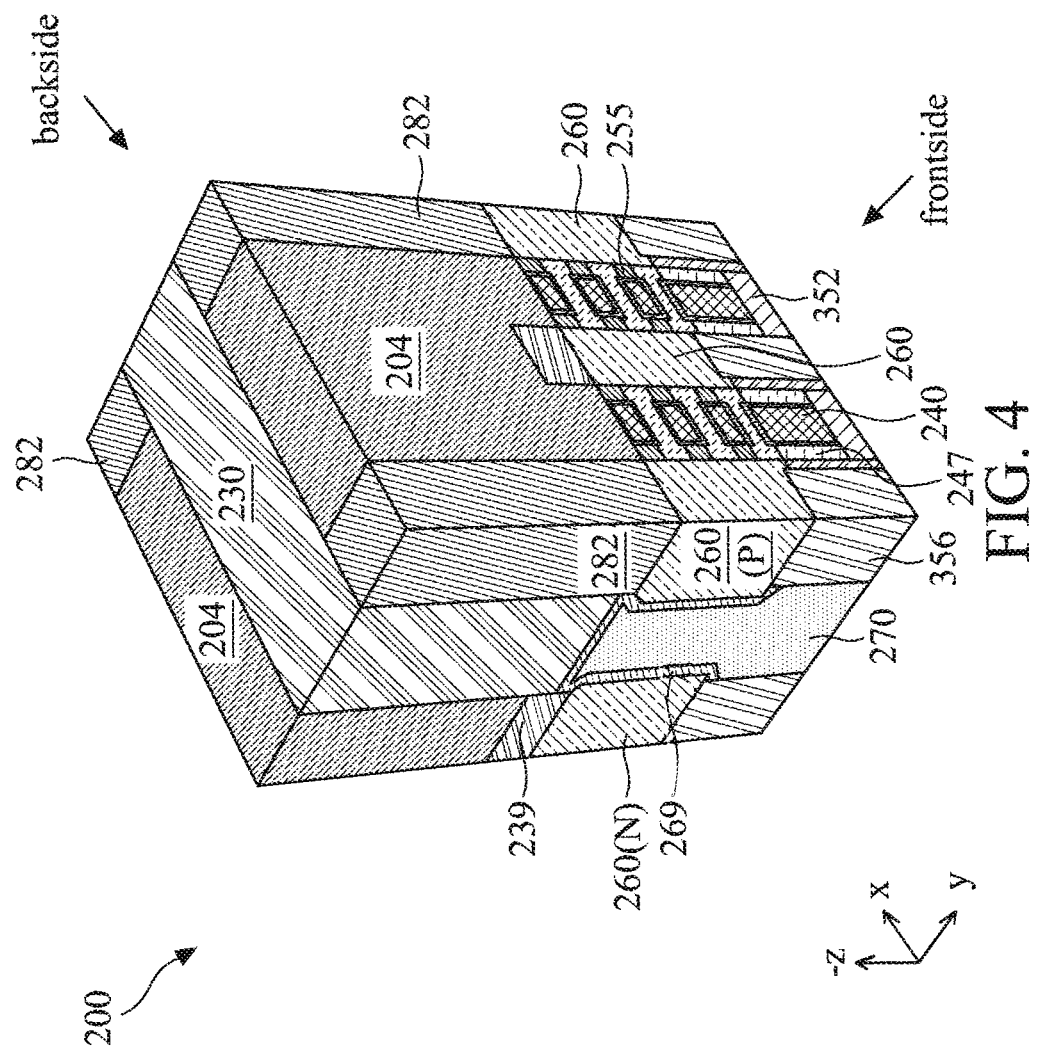

At operation 106, the method 100 (FIG. 1A) forms backside vias 282 electrically connecting to some of the S/D features 260. An embodiment of the resultant structure is shown in FIG. 4. The operation 106 includes a variety of processes. In an embodiment, the operation 106 selectively etches the semiconductor layer 239 to form holes that expose the S/D features 260. For example, the operation 106 may apply a wet etching process, a dry etching process, a reactive ion etching process, or another suitable etching process, where the etching process is tuned selectively to remove the semiconductor layer 239 and with little to no etching to the semiconductor fins 204 and the isolation structure 230. Once the S/D features 260 are exposed in the holes, the operation 106 may further partially recess the S/D features 260. Subsequently, the operation 106 deposits one or more metals into the holes and over the S/D features 260 to form the backside vias 282. The backside vias 282 may include tungsten (W), cobalt (Co), molybdenum (Mo), ruthenium (Ru), copper (Cu), nickel (Ni), titanium (Ti), tantalum (Ta), aluminum (Al), titanium nitride (TiN), tantalum nitride (TaN), or other metals, and may be formed by CVD, PVD, ALD, plating, or other suitable processes. The backside vias 282 may include more than one layers of materials in some embodiments. For example, the backside via 282 may include a barrier layer and one or more low-resistance metals on the barrier layer. The barrier layer may include titanium (Ti), tantalum (Ta), titanium nitride (TiN), tantalum nitride (TaN), tungsten (W), cobalt (Co), ruthenium (Ru), or other suitable material, and the low-resistance metals may include tungsten (W), cobalt (Co), molybdenum (Mo), ruthenium (Ru), aluminum (Al), or other metals. In some embodiments, the operation 106 forms a silicide feature (not shown) over the exposed surfaces of the S/D features 260 and then forms the backside vias 282 on the silicide feature. The silicide feature may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. The operation 106 may perform a CMP process to planarize the backside surface of the device 200 after depositing the one or more metals for the backside vias 282.

Figure 5:
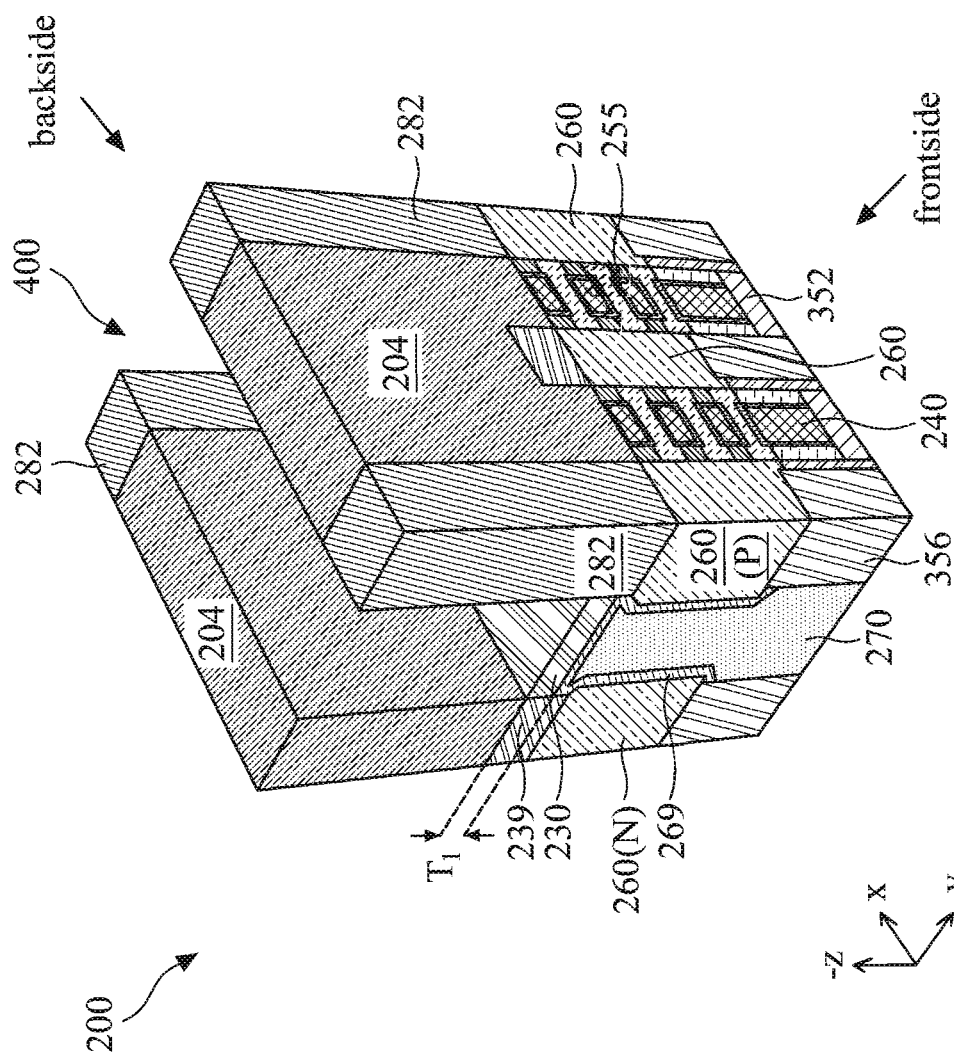

At operation 108, the method 100 (FIG. 1A) partially recesses the isolation structure 230 to thereby form a trench 400 over the backside of the device 200. An embodiment of the resultant structure is shown in FIG. 5. Referring to FIG. 5, the isolation structure 230 is etched back from the backside of the device 200 until a thin layer of the isolation structure 230 remains. In some embodiment, the remaining layer of the isolation structure 230 has a thickness $T_1$ in a range of about 4 nm to about 20 nm. This layer of the isolation structure 230 provides an isolation between the subsequently formed signal interconnection 406 (FIG. 11) and the gate stack 240 (see FIG. 18E). If this layer is too thin (such as less than 4 nm), the isolation may not be sufficient and there is a risk of shorting the signal interconnection 406 and the gate stack 240. If this layer is too thick (such as more than 20 nm), then the backside structures might be too thick and some of the backside vias 282 (such as the backside via 282 at the back-right corner of the device 200 in FIG. 14) might be too tall and have too much resistance for certain applications.

In an embodiment, the operation 108 may apply a wet etching process, a dry etching process, a reactive ion etching process, or another suitable etching process, where the etching process is tuned selectively to etch the isolation structure 230 and with little to no etching to the semiconductor fins 204 and the backside vias 282. The etching process can be controlled using a timer to obtain the desirable thin layer of the isolation structure 230. In an embodiment, the etching is self-aligned to the isolation structure 230 without using an etch mask. In another embodiment, the operation 108 forms an etch mask to cover areas of the device 200 (including areas of the isolation structure 230) where signal interconnections are not to be formed and etches the isolation structure 230 through the etch mask. After the etching finishes, the etch mask is removed. The etching produces the trench 400 at the backside of the device 200. Referring to FIG. 5, the bottom surface of the trench 400 is a surface of the isolation structure 230, the sidewalls of the trench 400 include sidewalls of the semiconductor fins 204 and sidewalls of the backside vias 282.

Figure 6:
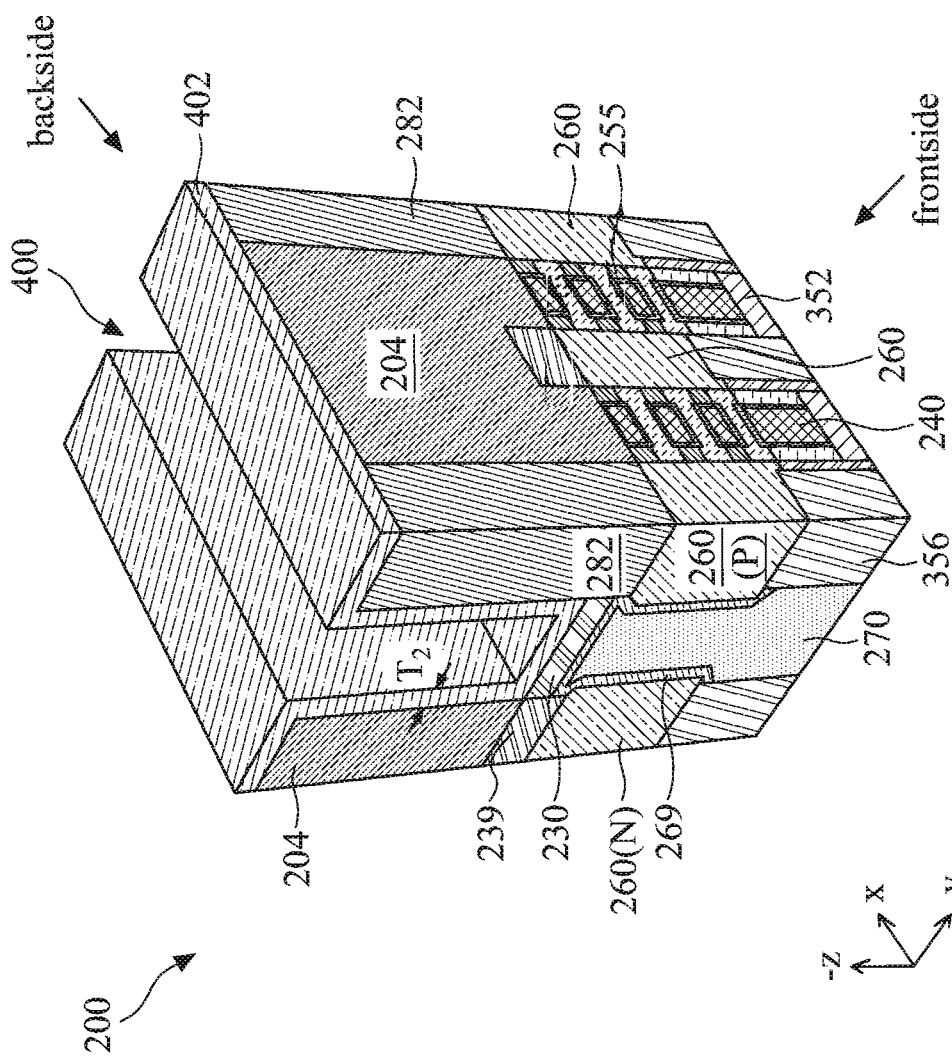

At operation 110, the method 100 (FIG. 1A) forms a dielectric spacer 402 on surfaces of the trench 400 and over the backside of the device 200. An embodiment of the resultant structure is shown in FIG. 6. Referring to FIG. 6, the dielectric spacer 402 is deposited on the surfaces of the isolation structure 230, the semiconductor fins 204, and the backside vias 282 that are exposed in the trench 400. The dielectric spacer 402 is also deposited on the backside surface of the device 200. In an embodiment, the dielectric spacer 402 includes a dielectric material having silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In an embodiment, the dielectric spacer 402 is deposited to have a uniform or substantially uniform thickness on the various surfaces discussed above. For example, the dielectric spacer 402 may be deposited using ALD or other suitable processes to achieve a uniform or substantially uniform thickness. In some embodiment, the dielectric spacer 402 has a thickness $T_2$ in a range from about 3 nm to about 8 nm. As will be discussed, the dielectric spacer 402 provides an isolation between a subsequently formed signal interconnection 406 and some of the backside vias 282 (see FIG. 11B for an example where the dielectric spacer 402 isolates the signal interconnection 406 from the via 282 at the back-right corner). If the dielectric spacer 402 is too thin (such as less than 3 nm), the isolation may not be sufficient and the risk of shorting the signal interconnection 406 and some of the backside vias 282 may be high. As will be further discussed, the dielectric spacer 402 and the signal interconnection 406 collectively fill the trench 400 (see FIG. 11A for an example). Thus, if the dielectric spacer 402 is too thick (such as more than 8 nm), then the signal interconnection may be too thin (and the resistance thereof may be too large) in some instances, depending on the pitch between the adjacent backside vias 282 along the "y" direction. In various embodiments, the dielectric spacer 402 may include a single layer of material or multiple layers of different materials.

At operation 112, the method 100 (FIG. 1A) patterns the dielectric spacer 402 to expose surfaces of some of the backside vias 282 that are to be connected by backside signal interconnections. This may involve a variety of processes including photolithograph and etching processes. An embodiment of the operation 112 is illustrated in FIGS. 7, 8A, and 8B where the backside vias 282 in the back-left and the front-right corners of the device 200 shown in FIGS. 7-8B are exposed after the dielectric spacer 402 is patterned.

Figure 7:
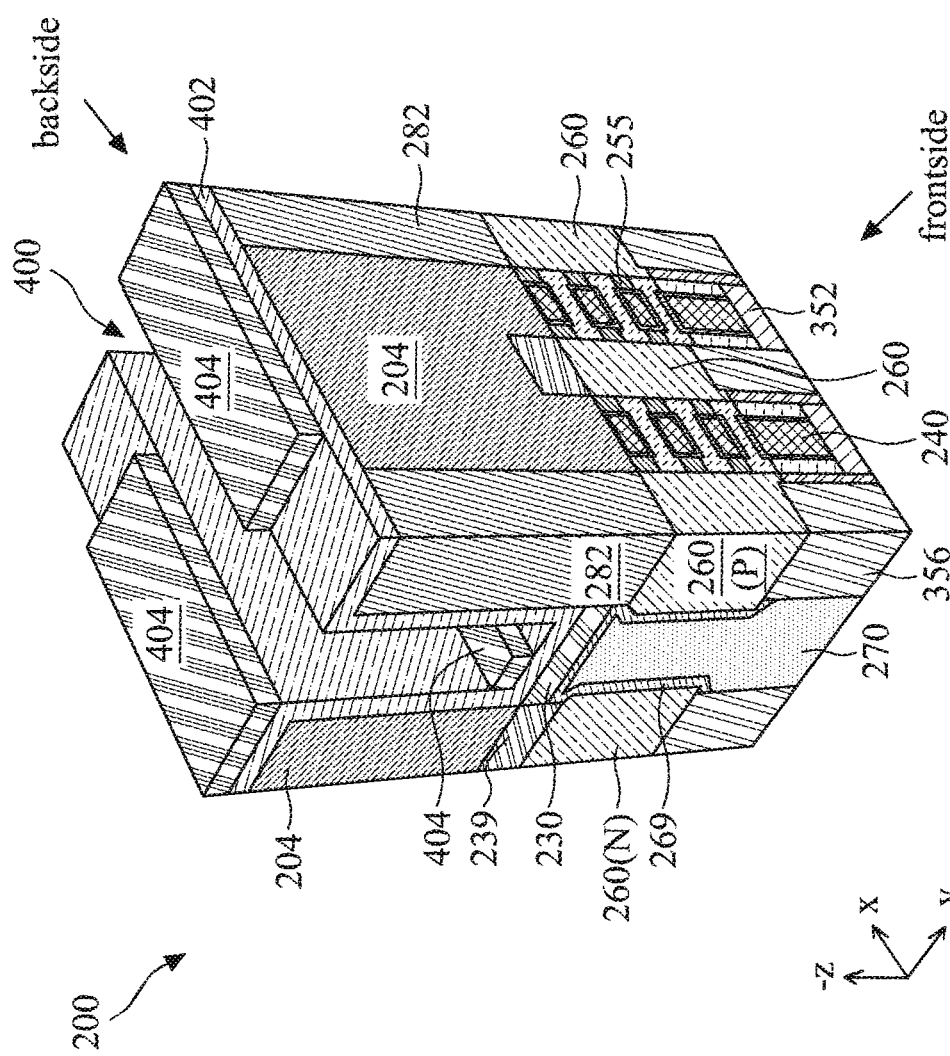

Referring to FIG. 7, a patterned etch mask 404 is formed over the backside of the device 200. The patterned etch mask 404 covers the portion of the dielectric spacer 402 that is not to be etched. The patterned etch mask 404 includes a material that is different than a material of the dielectric spacer 402 to achieve etching selectivity. In some embodiments, the patterned etch mask 404 includes a patterned photoresist (or resist). In some embodiments, the patterned etch mask 404 further includes an anti-reflective coating (ARC) layer or other layer(s) under the patterned resist. The present disclosure contemplates other materials for the patterned etch mask 404, so long as etching selectivity is achieved during the etching of the dielectric spacer 402. In some embodiments, the patterned etch mask 404 is formed by a photolithography process that includes spin-coating a resist layer, performing a pre-exposure baking process, performing an exposure process using a mask, performing a post-exposure baking process, and performing a developing process. After development, the resist layer is patterned into the etch mask 404 that corresponds with the mask. Alternatively, the exposure process can be implemented or replaced by other methods, such as maskless lithography, e-beam writing, ion-beam writing, or combinations thereof. It is noted that in the embodiment shown in FIG. 7, the patterned etch mask 404 is present on the top surface of the dielectric spacer 402 in selected areas and may or may not be present on the sidewalls of the dielectric spacer 402 inside the trench 400.

Figure 8A:
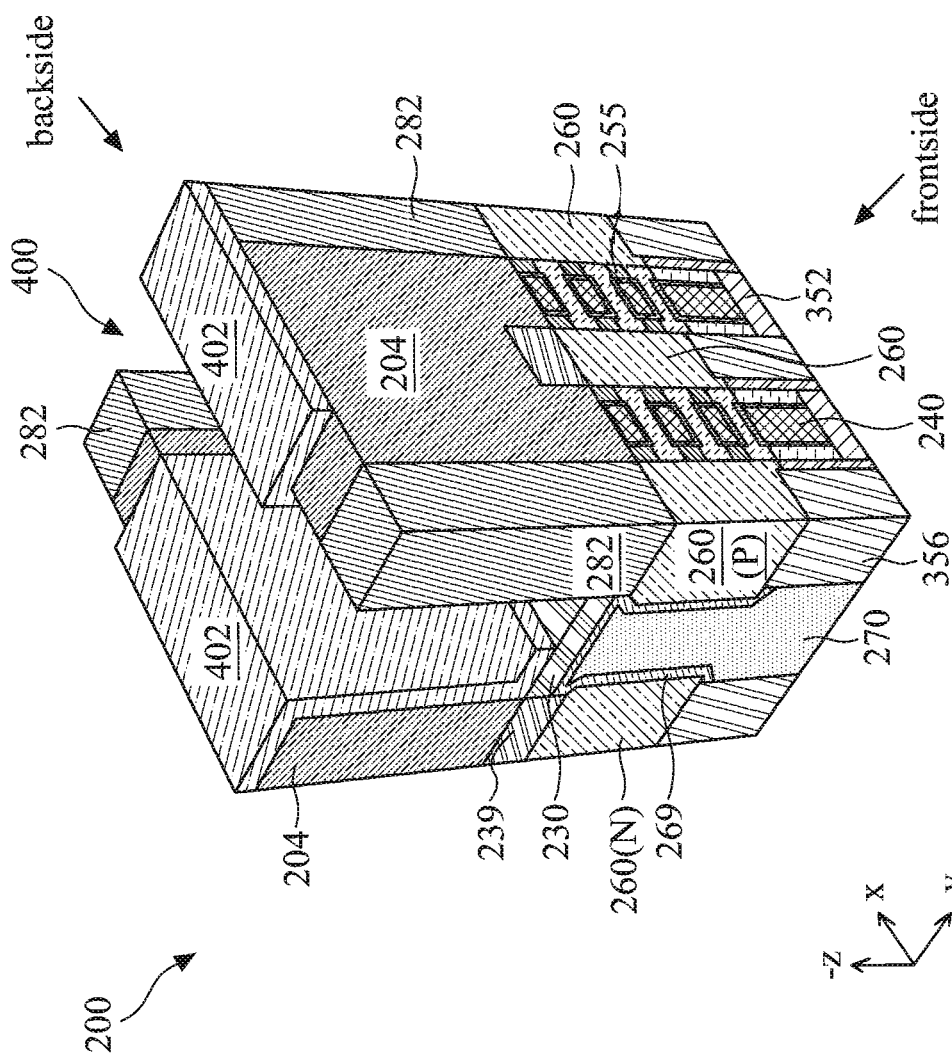
Figure 11A:
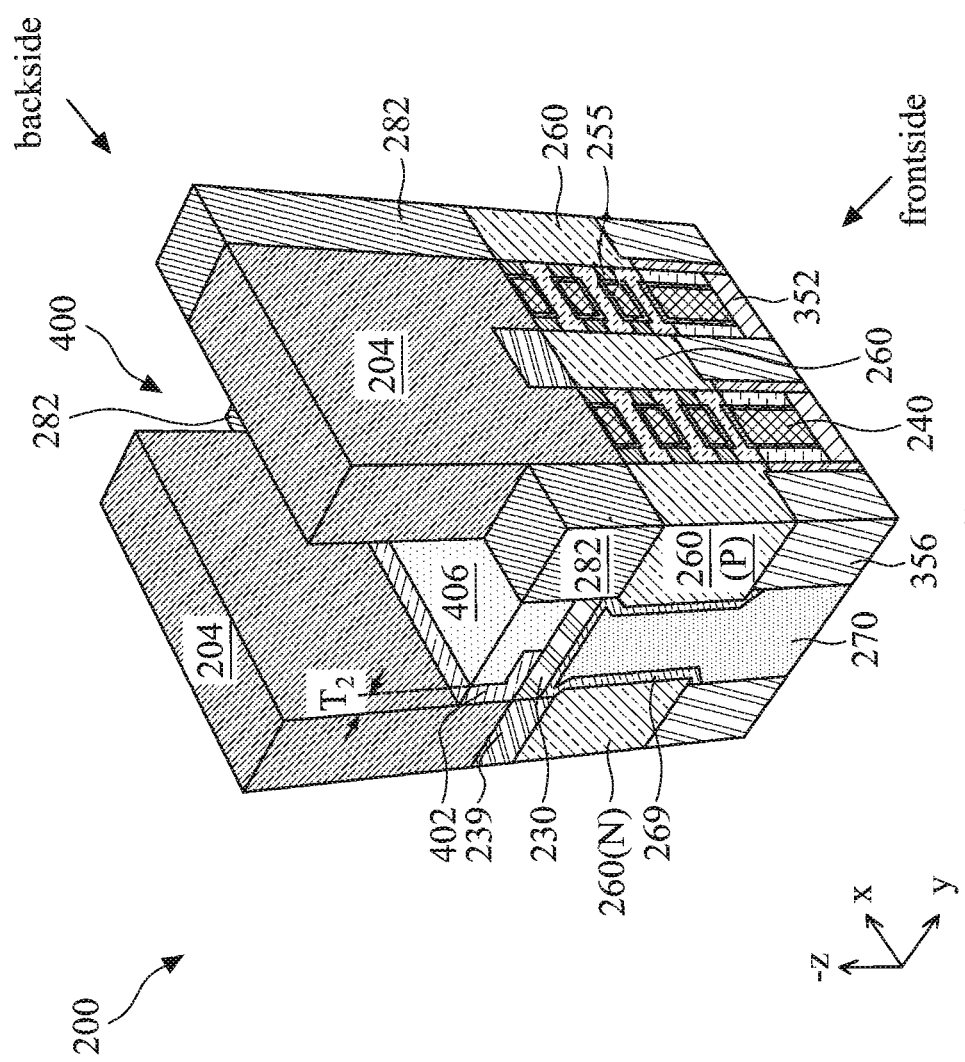
Figure 11B:
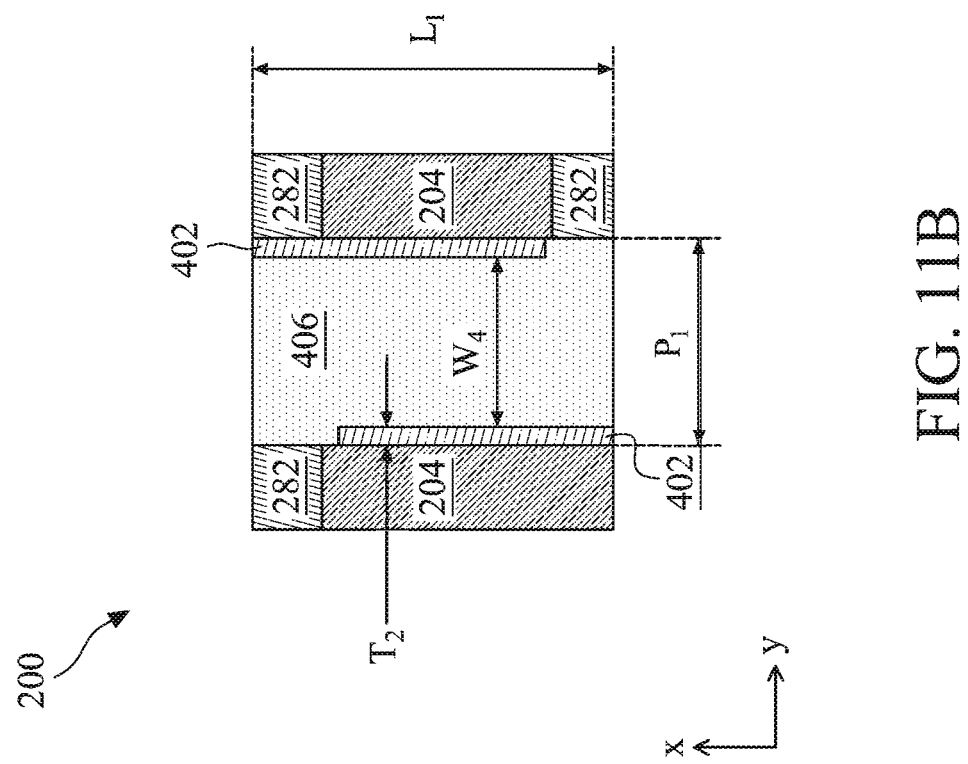

Referring to FIG. 8A, the operation 112 etches the dielectric spacer 402 through the patterned etch mask 404, thereby exposing top and sidewall surfaces of the backside vias 282 that are to be connected by backside signal interconnections (406 in FIGS. 11A and 11B). It also exposes portions of the semiconductor fins 204 and the isolation structure 230. In the present embodiment, the etching process is a dry etching process and is anisotropic (vertical etching). As a result, the portion of the dielectric spacer 402 on the sidewalls of the trench 400 and directly below the patterned etch mask 404 is not etched. The etching is tuned to be selective to the materials of the dielectric spacer 402 and with little to no etching to the semiconductor fins 204, the isolation structure 230, and the backside vias 282. After the etching is completed, the patterned etch mask 404 is removed, for example, by resist stripping, ashing, or other suitable process.

Figure 8B:
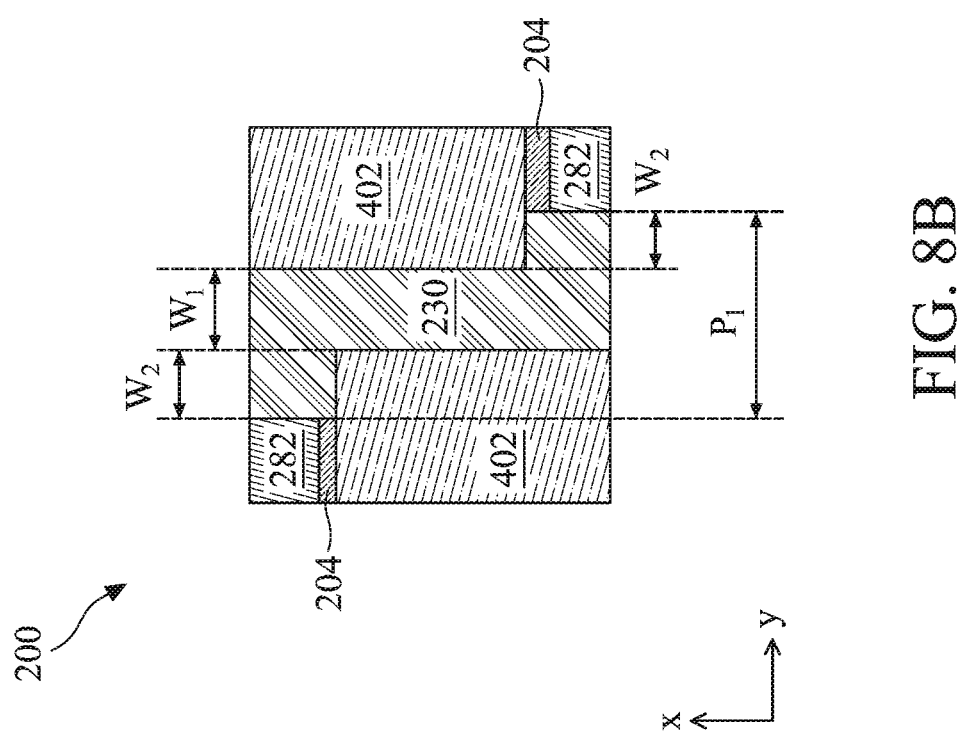
FIGS. 8B and 11B illustrates a plan view of a portion of the semiconductor device in FIG. 2A, according to some embodiments.

FIG. 8B shows a plan view of the device 200 from the backside of the device 200 after the operation 112 finishes. The shape of the exposed surface of the isolation structure 230 as shown in FIG. 8B can be defined by the photolithography in the operation 112 as discussed above. As shown, the distance between the two backside vias 282 along the "y" direction is $P_1$, which is approximately the distance between the S/D features 260(N) and 260(P) (FIG. 3). The exposed surface of the isolation structure 230 has a center portion lengthwise parallel to the "x" direction and two protrusions extending from the two ends of the center portion and towards opposite directions ("y" and "-y"). The center portion has a width $W_1$ in the "y" direction, and the two protrusions each has a width $W_2$ in the "y" direction. It holds that $P_1 = W_1 + 2W_2$. In some embodiments, the dimension $P_1$ is in a range of about 20 nm to about 60 nm. In an embodiment, the width $W_1$ is about half of the dimension $P_1$ with a variation in a range of about 3 nm to about 5 nm. In other words, $W_1 = (1/2) P_1 \pm \Delta$, where $\Delta$ is in a range of about 3 nm to about 5 nm. The variation A accounts for misalignment and other inaccuracies during photolithography. As will be discussed, the shape of the exposed surface of the isolation structure 230 as shown in FIG. 8B is the same as the shape of the bottom surface (when viewed from the backside of the device 200) of the signal interconnection 406 (FIG. 11A).

Figure 9:
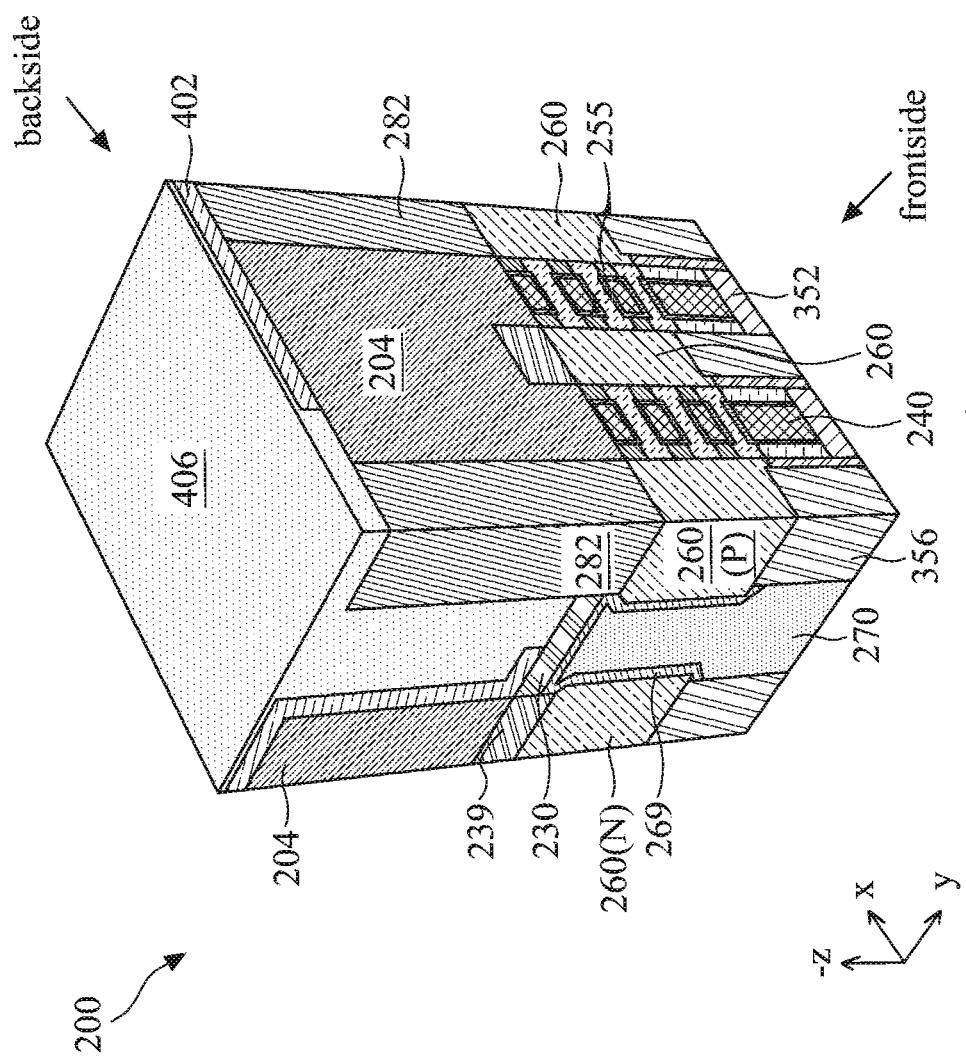
Figure 13:
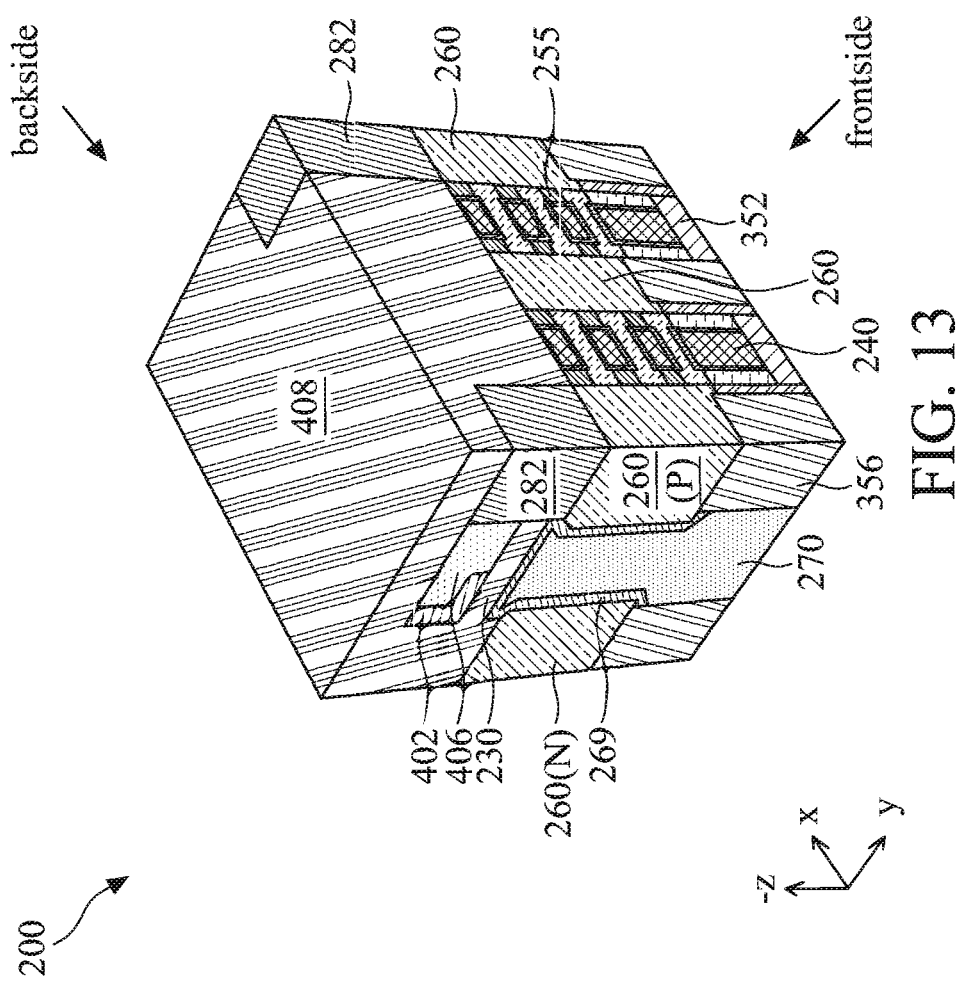

At operation 114, the method 100 (FIG. 1B) fills the trench 400 with one or more metals 406. Referring to FIG. 9, the one or more metals 406 are deposited on the isolation structure 230 and in direct contact with sidewall surfaces of the backside vias 282 exposed in the trench 400. The one or more metals 406 are also in direct contact with sidewall surfaces of the semiconductor fins 204 exposed in the trench 400. As will be discussed, the semiconductor fins 204 will be replaced with an insulating material 408 in a later step (FIG. 13). Thus, there is no concern of short circuits through the one or more metals 406 and the semiconductor fins 204. The one or more metals 406 may include tungsten (W), cobalt (Co), molybdenum (Mo), ruthenium (Ru), copper (Cu), nickel (Ni), titanium (Ti), tantalum (Ta), aluminum (Al), or other metals, and may be formed by CVD, PVD, ALD, plating, or other suitable processes. In some embodiments, the one or more metals 406 may include a barrier layer and one or more low-resistance metals on the barrier layer. The barrier layer may include titanium (Ti), tantalum (Ta), titanium nitride (TiN), tantalum nitride (TaN), tungsten (W), cobalt (Co), ruthenium (Ru), or other suitable material, and the low-resistance metals may include tungsten (W), cobalt (Co), molybdenum (Mo), ruthenium (Ru), aluminum (Al), or other metals.

Figure 10:
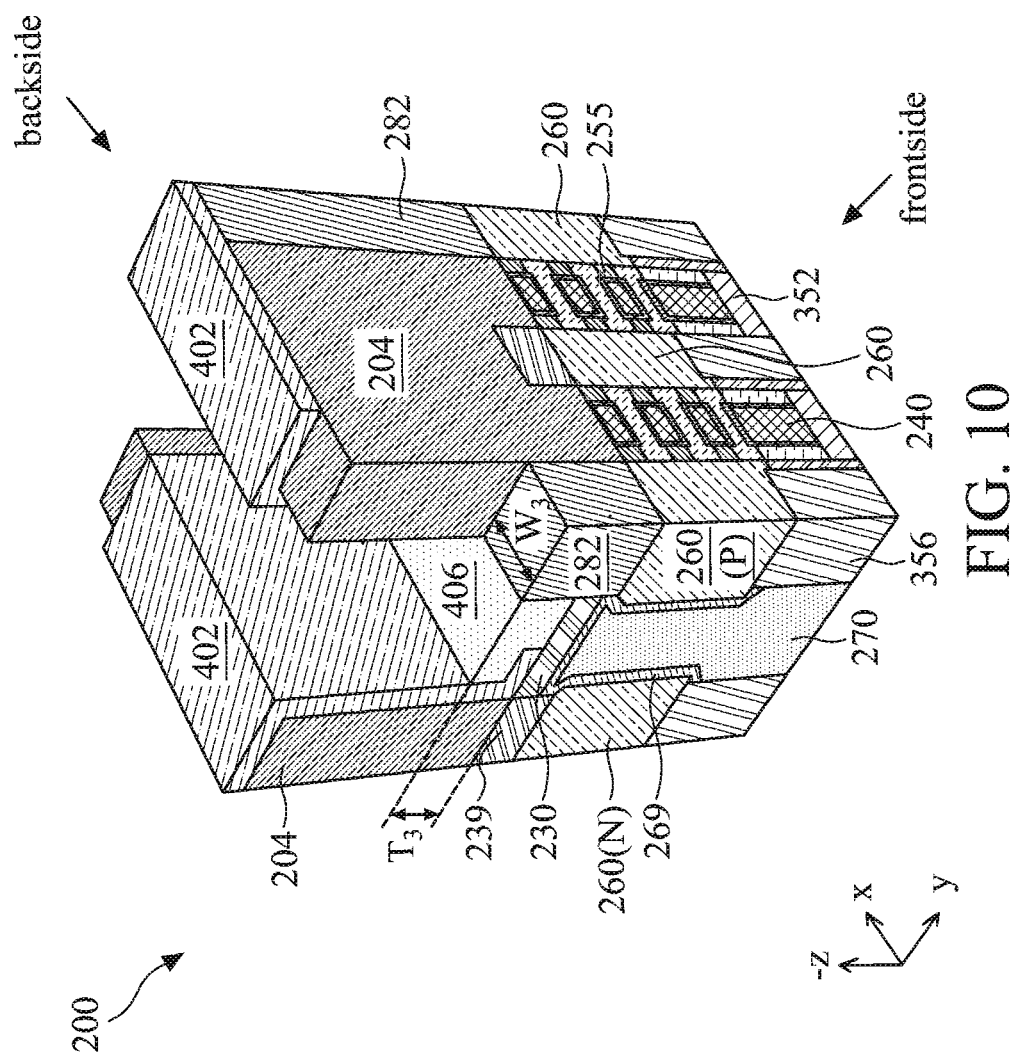

At operation 116, the method 100 (FIG. 1B) etches back the one or more metals 406 and the backside vias 282. A resultant structure is shown in FIG. 10. The operation 116 may apply one or more etching processes that are tuned to be selective to the materials of the one or more metals 406 and the backside vias 282 and with little to no etching to the dielectric spacer 402 and the semiconductor fins 204. The etching processes can include dry etching, wet etching, reactive ion etching, or other suitable processes. A portion of the one or more metals 406 remains in the trench 400 and becomes the signal interconnection 406 (or metal interconnection 406). The etching processes can be controlled using a timer so that the metal interconnection 406 achieves a desirable thickness $T_3$ (along the "z" or "-z" direction), such as in a range about 5 nm to about 20 nm. If the signal interconnection 406 is too thin (such as less than 5 nm), its resistance might be undesirably high for some applications. If the signal interconnection 406 is too thick (such as more than 20 nm), the backside of the device 200 may be unnecessarily tall. Further, this would undesirably increase the length and the resistance of some of the backside vias 282 that are connected to the backside power rails (such as the via 282 at the back-right corner of the device 200 in FIG. 14). The area of the contacting interface between the signal interconnection 406 and the backside via 282 is $T_3*W_3$, where $W_3$ is the width of the via 282 along the "x" direction. In some embodiments, $W_3$ is in a range of about 10 nm to about 30 nm.

At operation 118, the method 100 (FIG. 1B) etches back the patterned dielectric spacer 402. A resultant structure is shown in FIG. 11A. The operation 118 may apply one or more etching processes that are tuned to be selective to the materials of the patterned dielectric spacer 402 and with little to no etching to the signal interconnection 406, the backside vias 282, and the semiconductor fins 204. The etching processes can include dry etching, wet etching, reactive ion etching, or other suitable processes. A portion of the dielectric spacer 402 remains in the trench 400 and has an "L" shape from a front view. The vertical portion of the "L" shaped spacer 402 is disposed between the signal interconnection 406 and the semiconductor fin 204. The horizontal portion of the "L" shaped spacer 402 is disposed between the signal interconnection 406 and the isolation structure 230. FIG. 11B illustrates a plan view of the device 200 when viewed from the backside thereof. As shown in FIGS. 11A and 11B, the dielectric spacer 402 has a thickness $T_2$ along the "y" direction. In an embodiment, the thickness $T_2$ is in a range of about 3 nm to about 8 nm, whose significance has been discussed with reference to FIG. 6.

As shown in FIG. 11A, the top surface of the signal interconnection 406 is substantially flat and the bottom surface of the signal interconnection 406 has a step profile. A portion of the bottom surface of the signal interconnection 406 is disposed on the isolation structure 230 and another portion of the bottom surface of the signal interconnection 406 is disposed on the horizontal portion of the dielectric spacer 402. Thus, the signal interconnection 406 has an inverted "L" shape from a front view that complements the "L" shaped spacer 402. The vertical portion of the inverted "L" shape is disposed directly on the isolation structure 230 and the horizontal portion of the inverted "L" shape is disposed directly on the dielectric spacer 402. The portion of the signal interconnection 406 that is disposed directly on the isolation structure 230 has the same shape and dimensions as the exposed surface of the isolation structure 230 shown in FIG. 8B—with a center portion having a width $W_1$ and being lengthwise parallel to the "x" direction and two protrusions extending from the two ends of the center portion and towards opposite directions ("y" and "-y") and each having a width $W_2$. The top surface of the signal interconnection 406 is illustrated in FIG. 11B, which also has a center portion lengthwise parallel to the "x" direction and two protrusions extending from the two ends of the center portion and towards opposite directions ("y" and "-y"). The center portion of the top surface of the signal interconnection 406 has a width $W_4$ and the two protrusions thereof each has a width $T_2$ in the "y" direction. It holds that $P_1=W_4+2T_2$. The signal interconnection 406 has a length Li along the "x" direction. In an embodiment, the length Li is in a range of about 20 nm to about 1,000 nm. As shown in FIGS. 11A and 11B, a first sidewall surface of the signal interconnection 406 directly contacts the backside via 282 at the back-left corner, and a second sidewall surface of the signal interconnection 406 directly contacts the backside via 282 at the front-right corner, thereby connecting the two backside vias 282. It is noted that the device 200 is upside down in FIG. 11A. Thus, the top surface and the bottom surface of the signal interconnection 406 discussed above are the bottom surface and the top surface, respectively, of the signal interconnection 406 when the device 200 is viewed from the frontside.

Figure 12:
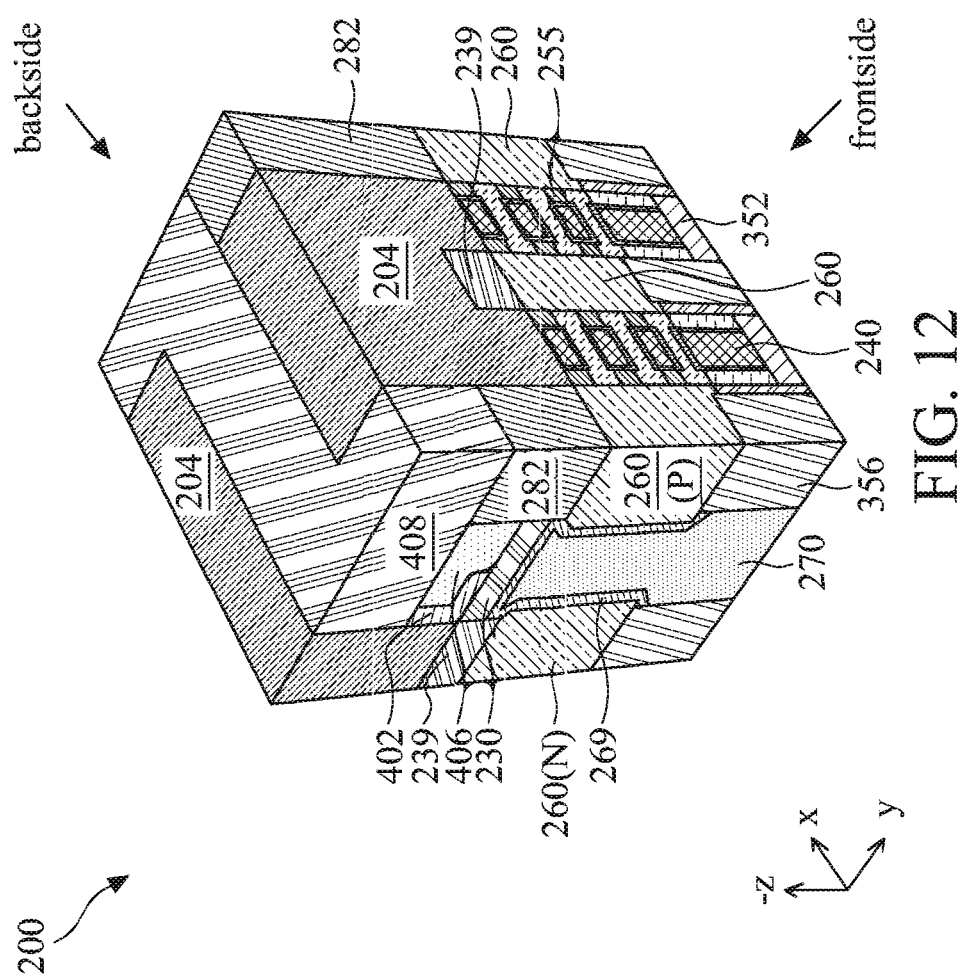

At operation 120, the method 100 (FIG. 1B) forms an isolation feature 408 over the signal interconnection 406 and filling the trench 400. A resultant structure is shown in FIG. 12. In an embodiment, the operation 120 includes depositing one or more dielectric materials over the signal interconnection 406 and filling the trench 400 and then performing a CMP process to planarize the backside surface of the device 200 and to expose the backside vias 282 and the semiconductor fins 204. A portion of the one or more dielectric materials remains in the trench 400 and becomes the isolation feature 408. The isolation feature 408 may include one layer of dielectric material or multiple layers of dielectric materials such as having a dielectric liner layer and a dielectric fill layer over the dielectric liner layer. In an embodiment, the isolation feature 408 includes a dielectric material having silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In some embodiments, the isolation feature 408 may include $La_2O_3$, $Al_2O_3$, ZnO, ZrN, $Zr_2Al_3O_9$, $TiO_2$, $TaO_2$, $ZrO_2$, $HfO_2$, $Y_2O_3$, AlON, TaCN, ZrSi, or other suitable material(s). The isolation feature 408 may be deposited using ALD, CVD, or other suitable methods.

At operation 122, the method 100 (FIG. 1B) replaces the semiconductor fins 204 with one or more dielectric materials. In an embodiment, the one or more dielectric materials are the same material(s) as those in the isolation feature 408, such as shown in FIG. 13. In another embodiment, the one or more dielectric materials are different material(s) than those in the isolation feature 408. The operation 122 may involve a variety of processes including etching and deposition processes. For example, the operation 122 may first perform one or more etching to remove the semiconductor fins 204 and the semiconductor layer 239 thereunder. The etching processes can include dry etching, wet etching, reactive ion etching, or other suitable processes. The etching processes are tuned to be selective to the materials of the semiconductor fins 204 and the semiconductor layer 239 and with little to no etching to the isolation feature 408, the signal interconnection 406, the dielectric spacer 402, the isolation structure 230, and the backside vias 282. After the semiconductor fins 204 and the semiconductor layer 239 thereunder are etched, trenches are formed at the backside of the device 200 and expose portions of some of the S/D features 260, inner spacers 255, and gate stacks 240. Subsequently, the operation 122 deposits one or more dielectric materials into the trenches and performs a CMP process to planarize the backside of the device 200 and to expose some of the backside vias 282 (such as the backside via 282 at the back-right corner in FIG. 13) that are to be connected to backside power rails.

Figure 14:
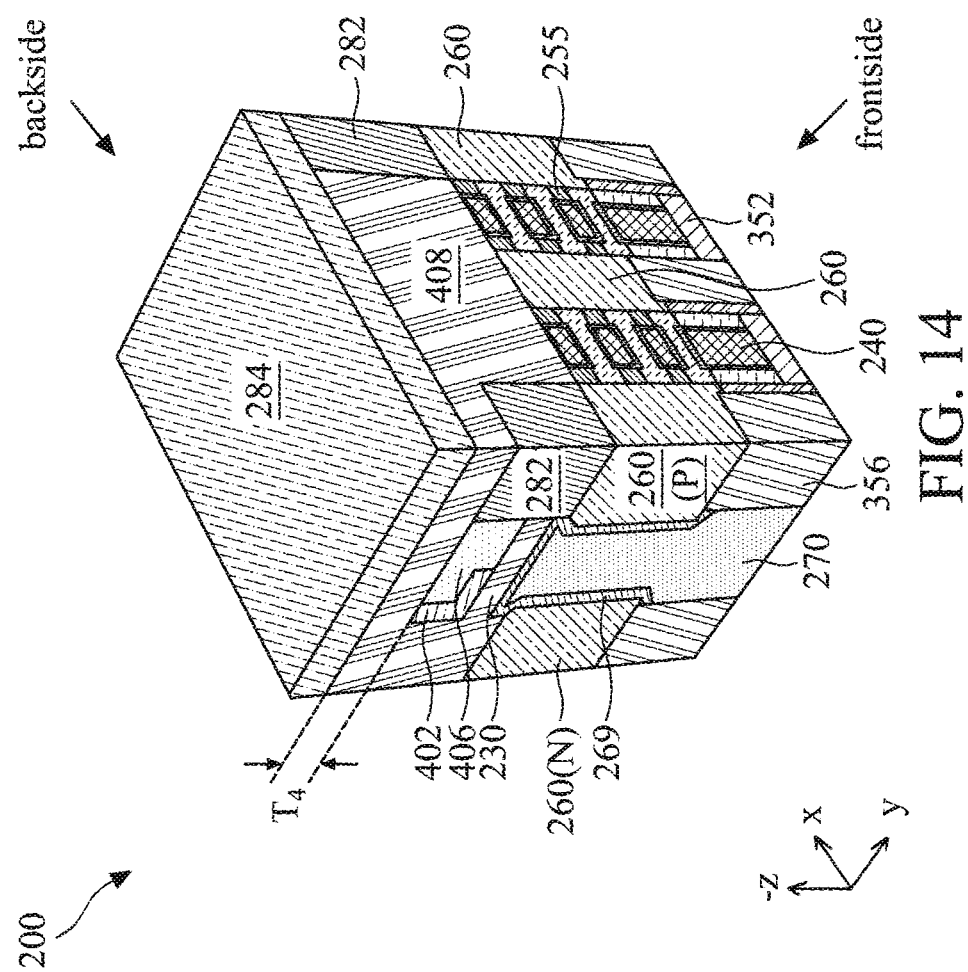

At operation 124, the method 100 (FIG. 1B) forms one or more backside power rails 284. The resultant structure is shown in FIG. 14 according to an embodiment. As illustrated in FIG. 14, some of the backside vias 282 (such as the backside via 282 at the back-right corner in FIG. 14) are electrically connected to the backside power rails 284. In an embodiment, the backside power rails 284 may be formed using a damascene process, a dual-damascene process, a metal patterning process, or other suitable processes. The backside power rails 284 may include tungsten (W), cobalt (Co), molybdenum (Mo), ruthenium (Ru), copper (Cu), nickel (Ni), titanium (Ti), tantalum (Ta), titanium nitride (TiN), tantalum nitride (TaN), or other metals, and may be deposited by CVD, PVD, ALD, plating, or other suitable processes. Although not shown in FIG. 14, the backside power rails 284 are embedded in one or more dielectric layers. Having backside power rails 284 beneficially increases the number of metal tracks available in the device 200 for directly connecting to source/drain contacts and vias. It also increases the gate density for greater device integration than other structures without the backside power rails 284. The backside power rails 284 may have wider dimension than the first level metal (M0) tracks on the frontside of the device 200, which beneficially reduces the backside power rail resistance. The isolation feature 408 disposed between the backside power rail 284 and the signal interconnection 406 has a thickness $T_4$. In some embodiments, the thickness $T_4$ is in a range of about 4 nm to about 20 nm. If the thickness $T_4$ is too small (such as less than 4 nm), the coupling capacitance between the signal interconnection 406 and the backside power rail 284 might be undesirably high for some applications, and the isolation effects might not be sufficient. If the thickness $T_4$ is too large (such as more than 20 nm), the length and the resistance of some of the backside vias 282 (such as the backside via 282 at the back-right corner in FIG. 14) might be undesirably large for some applications.

At operation 126, the method 100 (FIG. 1B) performs further fabrication processes to the device 200. For example, it may form one or more interconnect layers on the backside of the device 200, form passivation layers on the backside of the device 200, and perform other back end of line (BEOL) processes.

Figure 15:
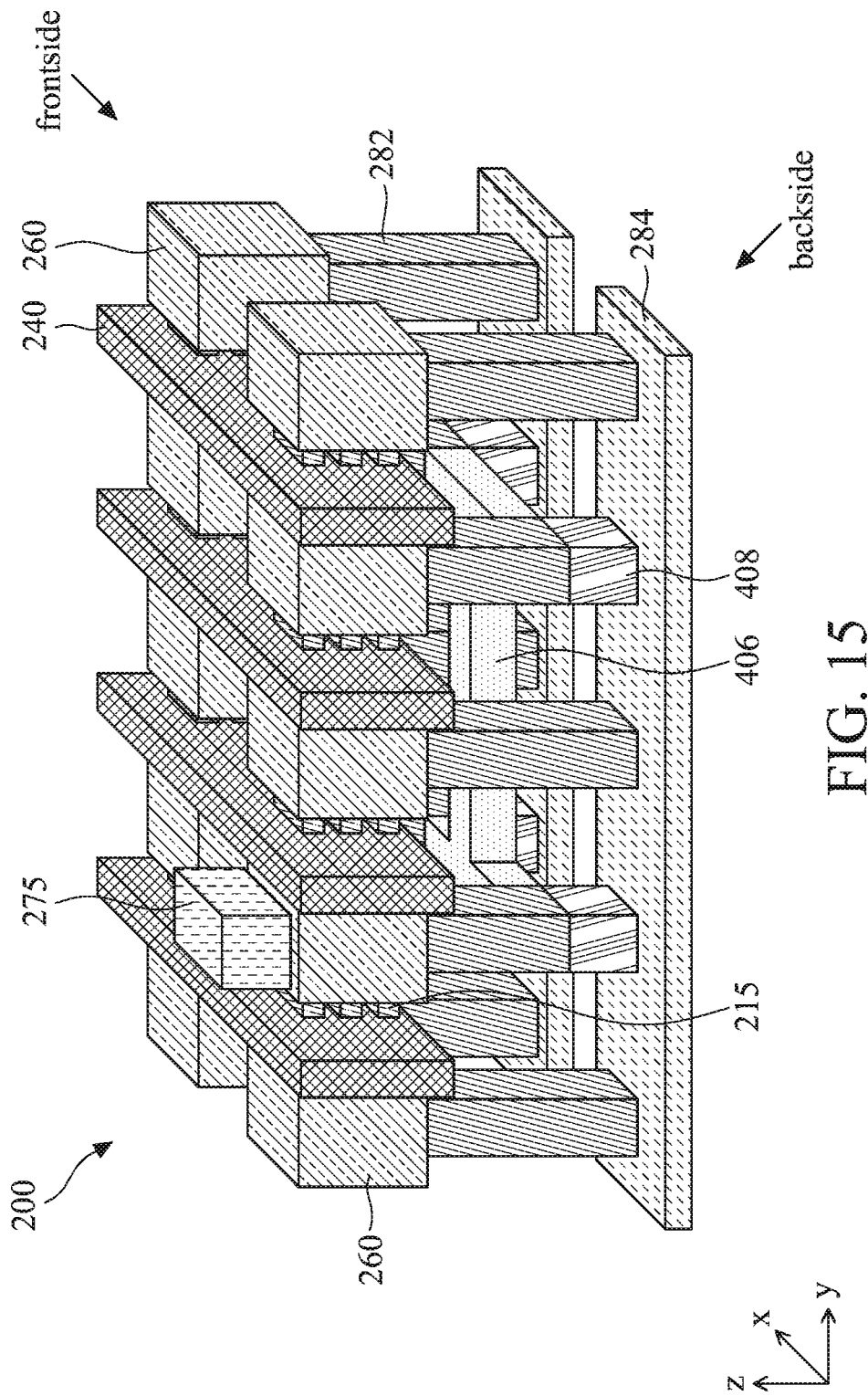

FIG. 15 illustrates a perspective view of the device 200 according to an embodiment. As shown in FIG. 15, the device 200 includes backside power rails 284 and backside vias 282. Some of the backside vias 282 vertically connect some of the S/D features 260 to the backside power rails 284. Some of the backside vias 282 are connected to some of the S/D features 260 but are isolated from the backside power rails 284 by the isolation features 408. The signal interconnection 406 connects multiple backside vias 282. In this embodiment (as well as in the embodiment shown in FIG. 14), the signal interconnection 406 is isolated from the gate stacks 204. Channel layers 215 are stacked one over another vertically and are connected between pairs of the S/D features 260. Gate stacks 240 engage the channel layers 215 and wrap around each of the channel layers 215. Some of the S/D features 260 are provided with both frontside contacts 275 and backside vias 282.

FIGS. 16A-E illustrate various non-limiting examples where the signal interconnection 406 can be implemented in the device 200. FIG. 16A illustrates an example where the signal interconnection 406 establishes a connection between an S/D of a transistor and another S/D of an adjacent transistor. FIG. 16B illustrates an example where the signal interconnection 406 establishes a connection between an S/D of a transistor and another S/D of another transistor that is not adjacent (i.e., there are intervening transistors between the two transistors). The signal interconnection 406 in FIGS. 16A and 16B can be formed with the operations discussed above with reference to FIGS. 1A-15. FIG. 16C illustrates an example where the signal interconnection 406 establishes a connection between an S/D of a transistor and a gate of an adjacent transistor. FIG. 16D illustrates an example where the signal interconnection 406 establishes a connection between a gate of a transistor and another gate of an adjacent transistor. FIG. 16E illustrates an example where the signal interconnection 406 establishes a connection between a gate of a transistor and another gate of another transistor that is not adjacent (i.e., there are intervening transistors between the two transistors).

FIGS. 17A-G illustrate perspective views of the device 200 during various operations in an embodiment of the method 100 where the signal interconnection 406 establishes a connection between two gates (such as the examples in FIGS. 16D and 16E). Some aspects of the FIGS. 17A-G are similar to the FIGS. 3-15 discussed above. The device 200 in each of the FIGS. 17A-G are provided upside down. Further, the side view of the device 200 (that exposes the gate stacks 240) may be provided as a cross-sectional view cut along the F-F line in FIG. 2C. Thus, the channel layers 215 are not shown in FIGS. 17A-G. FIGS. 17A-G and the methods associated therewith are briefly discussed below.

Figures 17A, 17B:
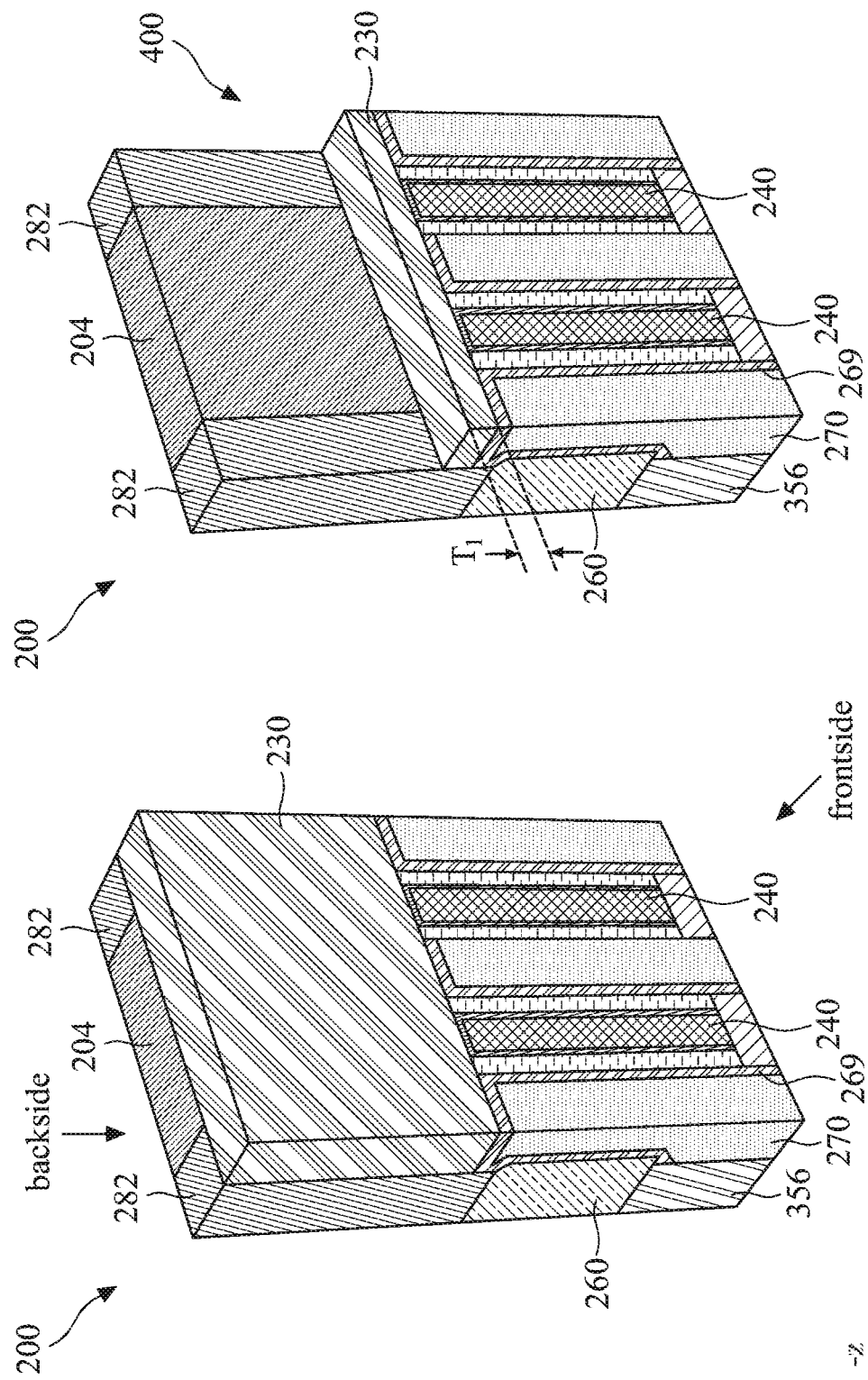

As shown in FIG. 17A, the device 200 is provided with various features 260, 356, 269, 270, 240, 230, 204, and 282, which have been discussed above. The device 200 shown in FIG. 17A may be formed by operations 102, 104, and 106 (FIG. 1A). Particularly, the isolation structure 230 is provided at the backside of the gate stacks 240, and the backside vias 282 are formed and connecting to some of the S/D features 260.

As shown in FIG. 17B, the isolation structure 230 is etched back from the backside of the device 200 until a thin layer of the isolation structure 230 remains. In some embodiment, the remaining layer of the isolation structure 230 has a thickness $T_1$ in a range of about 4 nm to about 20 nm, the significance of which has been discussed with reference to FIG. 5. The isolation structure 230 can be etched with any suitable etching process that is selective to the material of the isolation structure 230 and with little to no etching to the semiconductor fins 204 and the backside vias 282. The etching process can be controlled using a timer to obtain the desirable thin layer of the isolation structure 230. In an embodiment, an etch mask is formed to cover areas of the device 200 where signal interconnections are not to be formed, and then the isolation structure 230 is etched through the etch mask. After the etching finishes, the etch mask is removed. The etching back of the isolation structure 230 results in a trench 400 at the backside of the device 200.

As shown in FIG. 17C, a dielectric spacer 402 is formed to cover various surfaces at the backside of the device 200, including various surfaces of the trench 400, similar to the operation 110 discussed above. For example, the dielectric spacer 402 may be formed to have a uniform or substantially uniform thickness. Then, the dielectric spacer 402 and the isolation structure 230 are patterned using photolithography and etching processes to form holes 401 therein that expose the gate stacks 240 for making a signal connection thereto, similar to the operation 112 discussed above.

As shown in FIG. 17D, one or more metals 406 are deposited to fill the trench 400 and the holes 401, similar to the operation 114 discussed above. Then, the one or more metals 406 are etched back, similar to the operation 116 discussed above. The remaining portion of the one or more metals 406 become a signal interconnection (or metal interconnection) 406 that connects two gates 240 of two transistors. In this embodiment, the top surface of the signal interconnection 406 is flat or substantially flat and the bottom surface of the signal interconnection 406 has two protrusions whose bottom surfaces directly contact the gate stacks 240. It is noted that the device 200 is upside down in FIG. 17D. Thus, the top surface and the bottom surface of the signal interconnection 406 discussed above are the bottom surface and the top surface, respectively, of the signal interconnection 406 when the device 200 is viewed from the frontside.

Figure 17E:
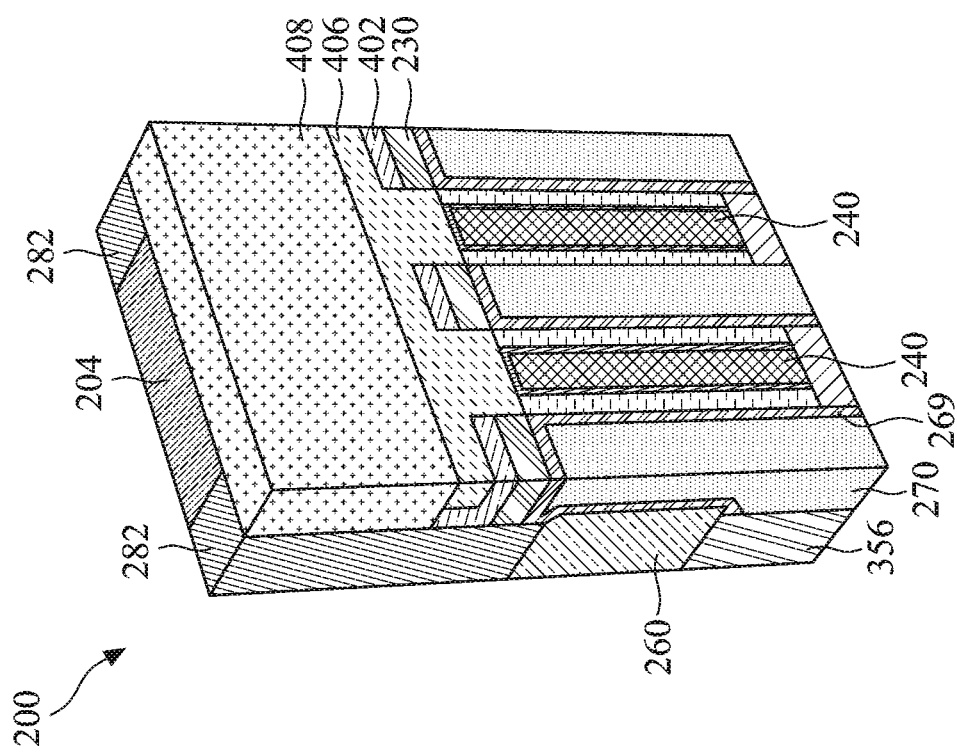
Figure 17F:
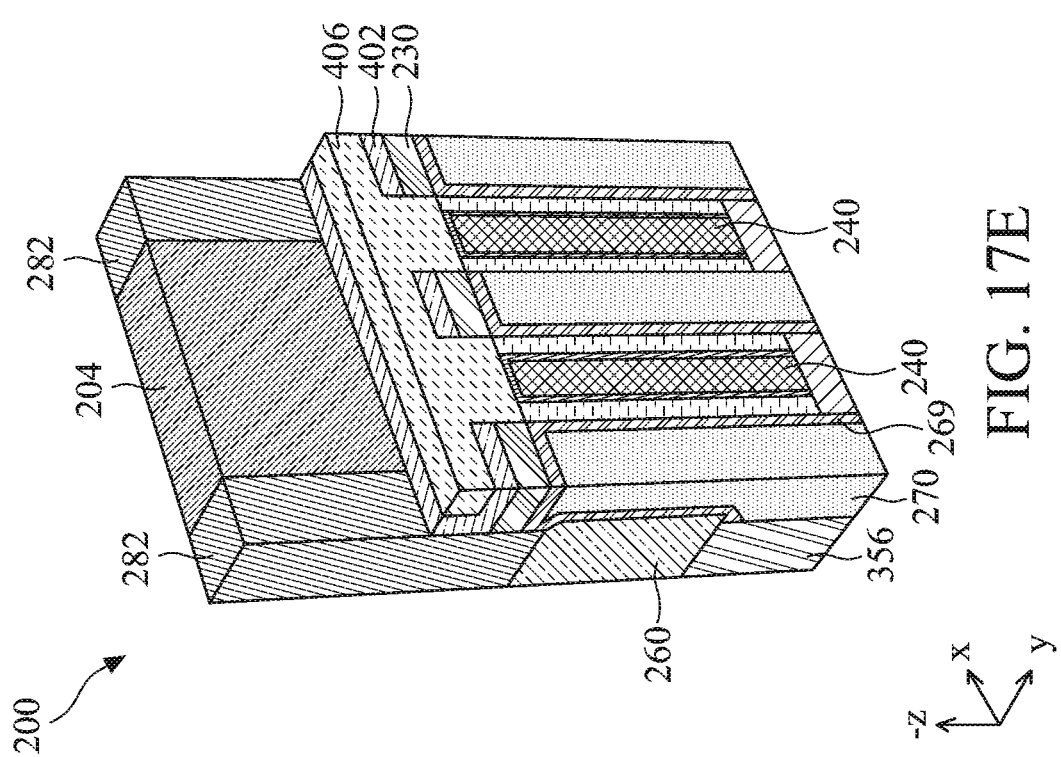
Figure 17G:
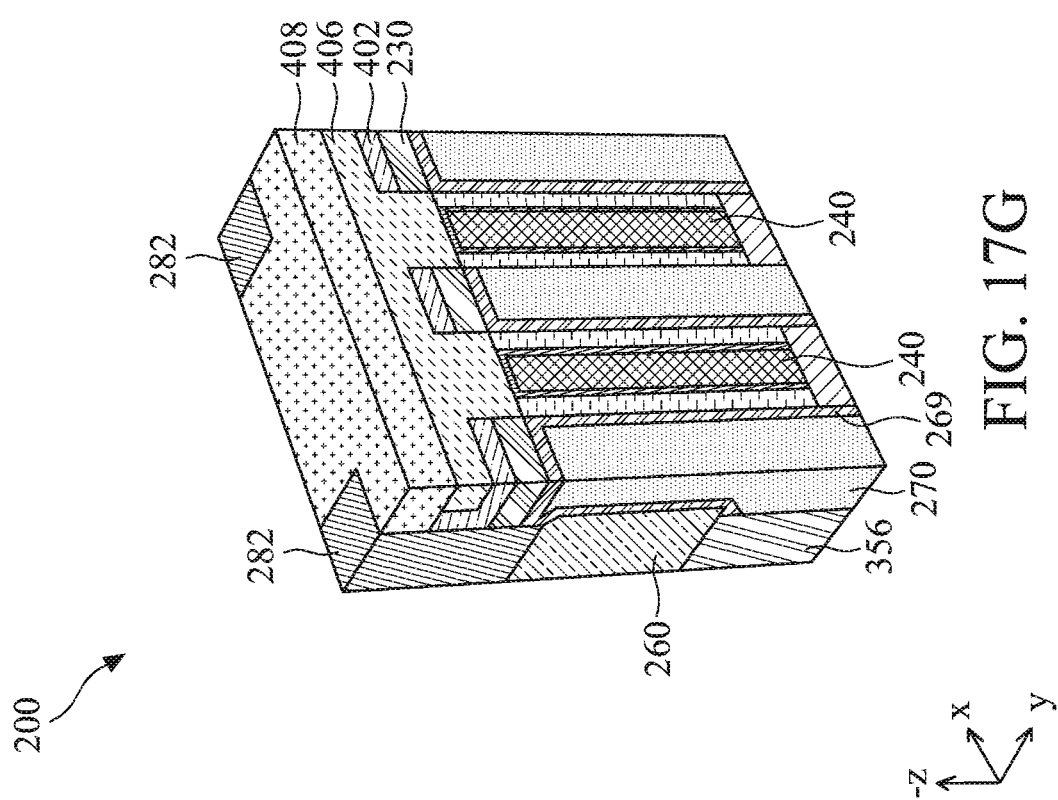

As shown in FIG. 17E, the dielectric spacer 402 is partially etched back, similar to the operation 118 discussed above. As shown in FIG. 17F, an isolation feature 408 is formed over the signal interconnection 406, similar to the operation 120 discussed above. As shown in FIG. 17G, the semiconductor fins 204 are replaced with an insulator material, similar to the operation 122 discussed above.

FIGS. 18A-H illustrate perspective views of the device 200 during various operations in an embodiment of the method 100 where the signal interconnection 406 establishes a connection between an S/D feature and a gate (such as the example in FIG. 16C). Some aspects of the FIGS. 18A-H are similar to the FIGS. 3-15 discussed above. The device 200 in each of the FIGS. 18A-H are provided upside down.

Further, the side view of the device 200 (that exposes the gate stacks 240) may be provided as a cross-sectional view cut along the F-F line in FIG. 2C. Thus, the channel layers 215 are not shown in FIGS. 18A-H. FIGS. 18A-H and the methods associated therewith are briefly discussed below.

Figure 18B:
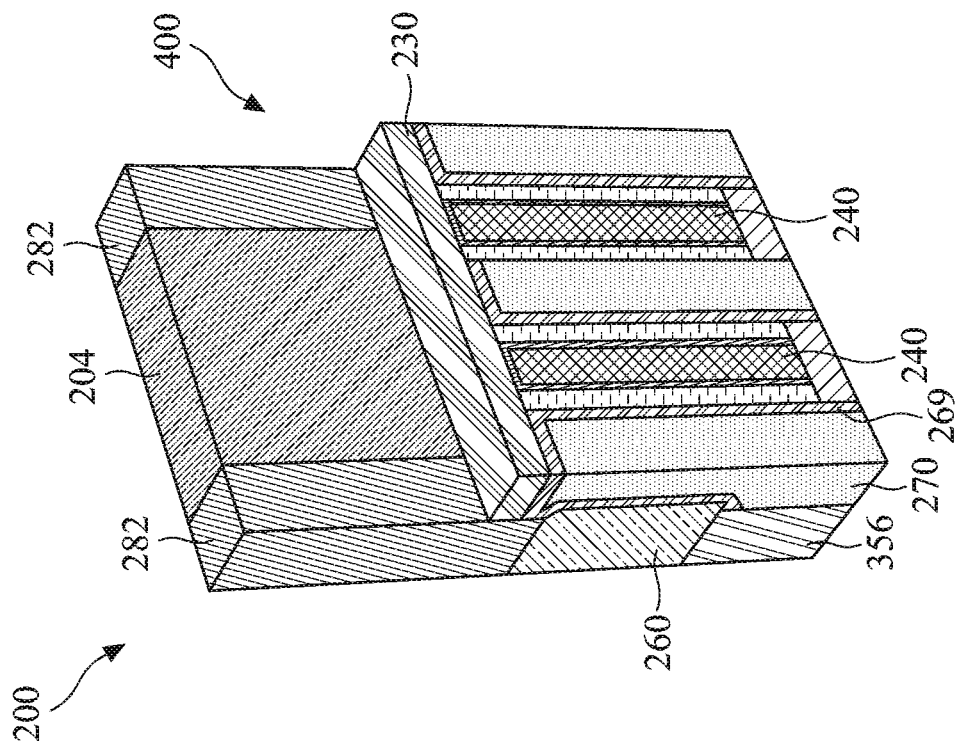
Figure 18A:
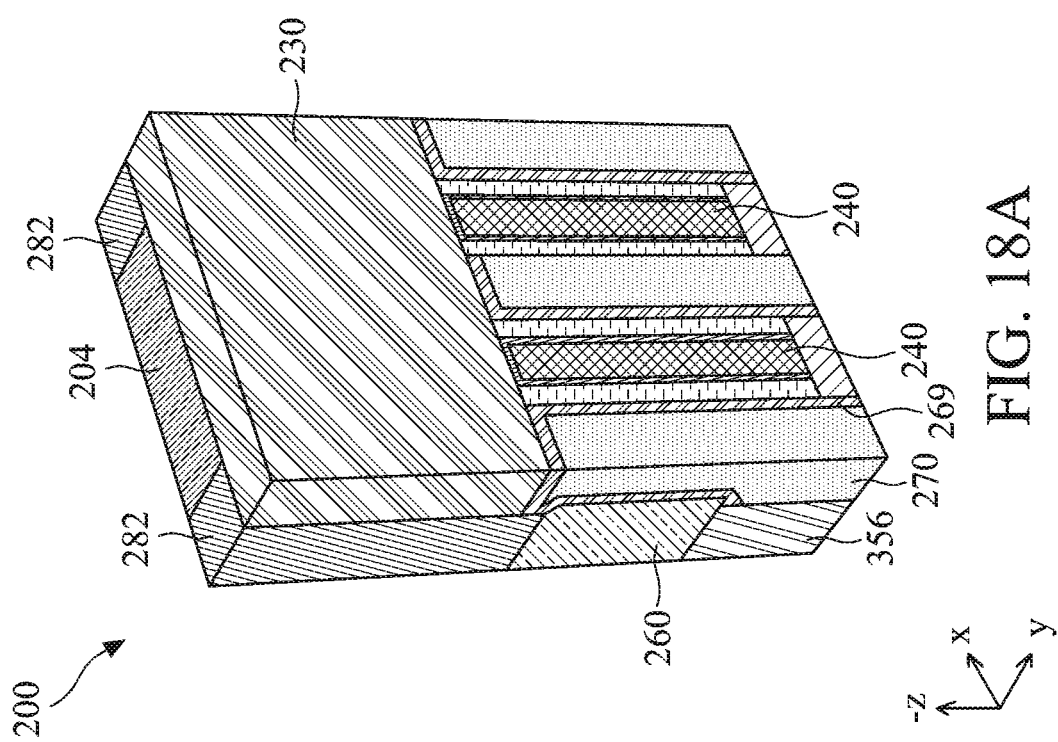
Figures 18C, 18D:
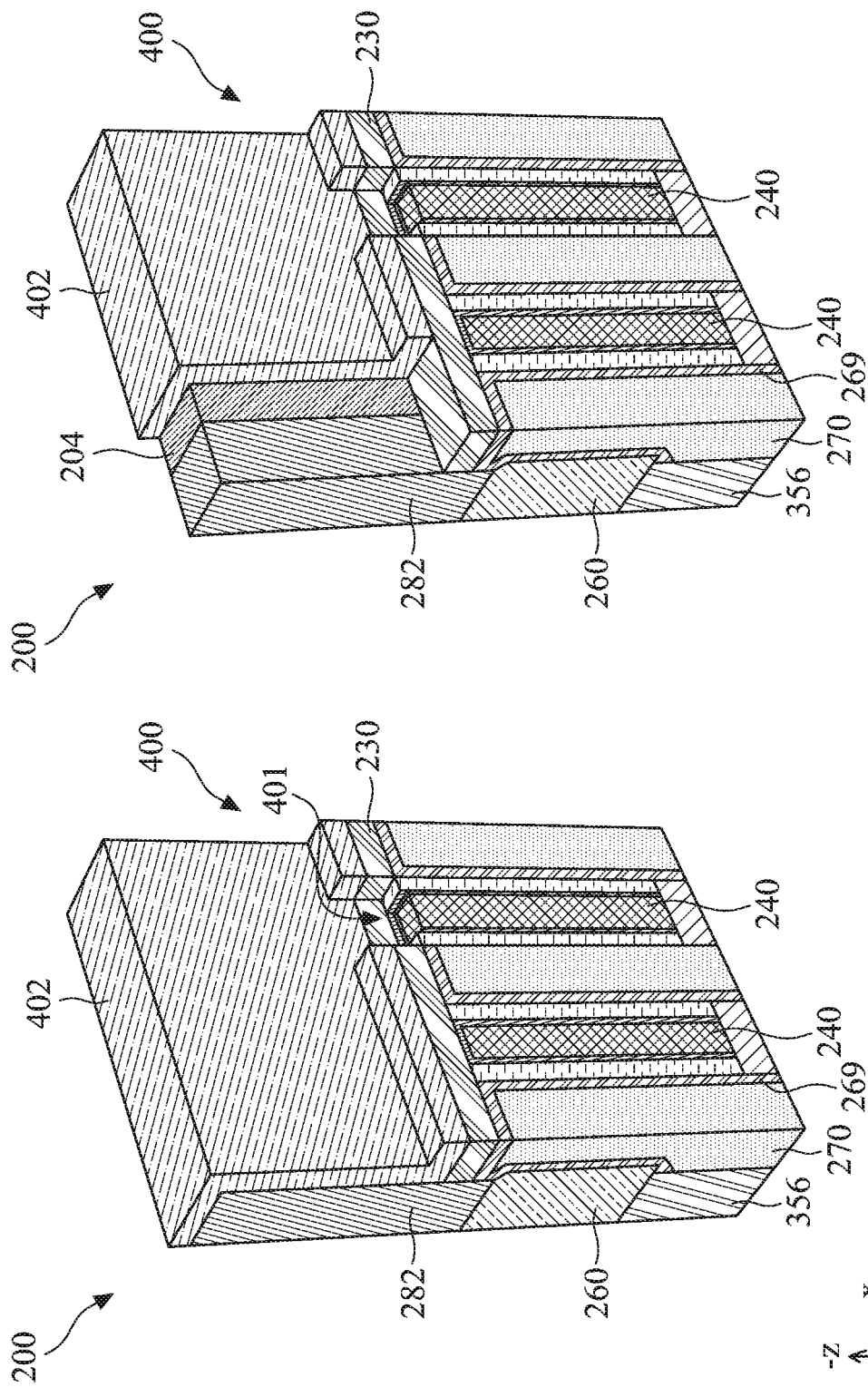

FIGS. 18A and 18B are the same as FIGS. 17A and 17B, respectively. Thus, the discussion of FIGS. 18A and 18B are omitted herein. As shown in FIG. 18C, a dielectric spacer 402 is formed to cover various surfaces at the backside of the device 200, including various surfaces of the trench 400, similar to the operation 110 discussed above. For example, the dielectric spacer 402 may be formed to have a uniform or substantially uniform thickness. Then, the dielectric spacer 402 and the isolation structure 230 are patterned using photolithography and etching processes to form a hole 401 therein that exposes the gate stack 240 for making a signal connection thereto, similar to the operation 112 discussed above.

As shown in FIG. 18D, the dielectric spacer 402 is patterned again using photolithography and etching processes to expose the backside via 282 for making a signal connection thereto, similar to the operation 112 discussed above. The etching process used for FIG. 18D is tuned selective to the material of the dielectric spacer 402 and with little to no etching to the backside via 282, the semiconductor fin 204, and the isolation structure 230.

Figures 18E, 18F:
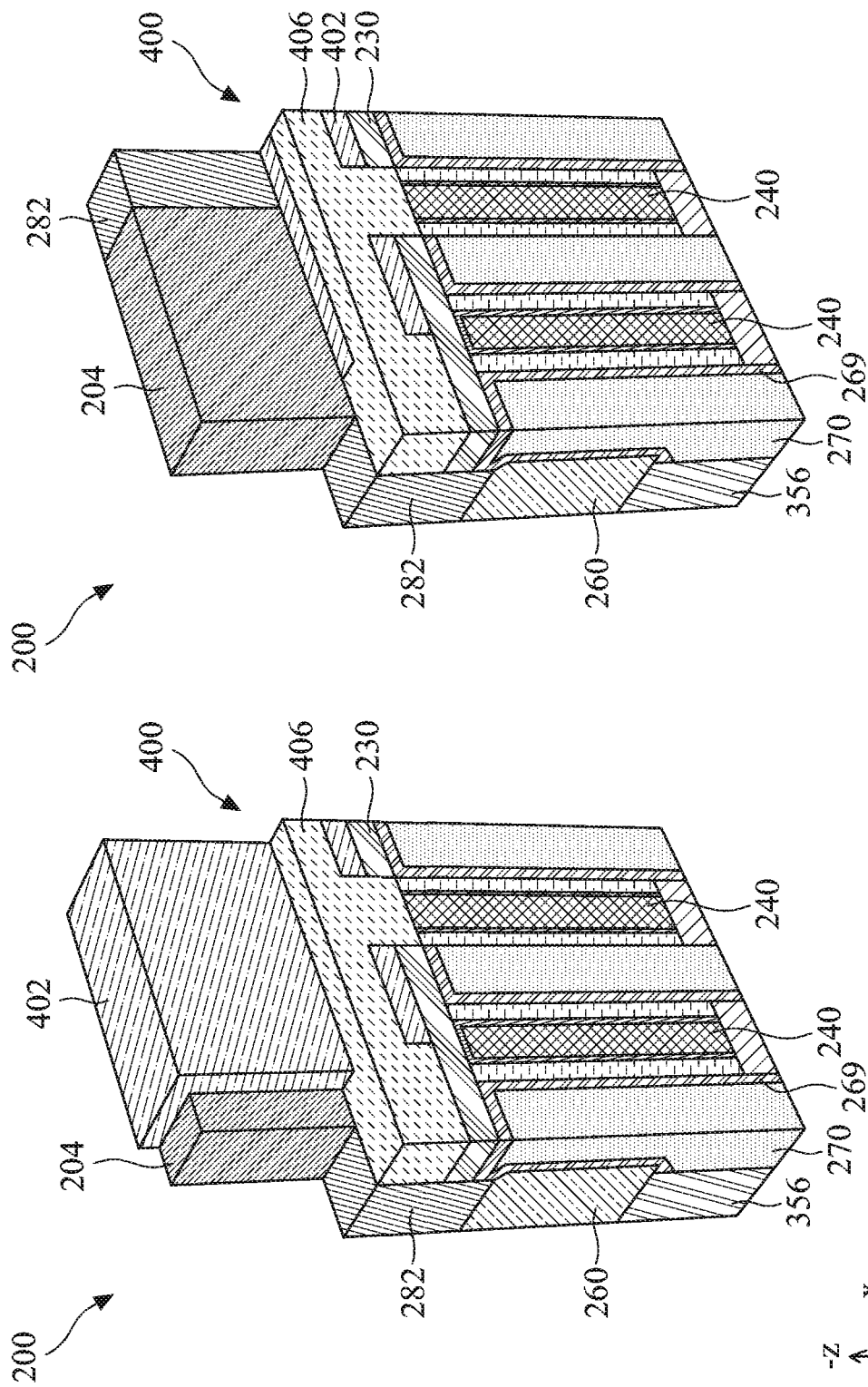

As shown in FIG. 18E, one or more metals 406 are deposited to fill the trench 400 and the hole 401, similar to the operation 114 discussed above. Then, the one or more metals 406 and the backside via 282 are etched back, similar to the operation 116 discussed above. The remaining portion of the one or more metals 406 become a signal interconnection (or metal interconnection) 406 that connects a gate 240 to an S/D feature 260. In this embodiment, the top surface of the signal interconnection 406 is flat or substantially flat and the bottom surface of the signal interconnection 406 has two protrusions. The bottom surface of one of the protrusions directly contacts the gate stack 240, and the sidewall surface of another one of the protrusions directly contacts the backside via 282. It is noted that the device 200 is upside down in FIG. 18E. Thus, the top surface and the bottom surface of the signal interconnection 406 discussed above are the bottom surface and the top surface, respectively, of the signal interconnection 406 when the device 200 is viewed from the frontside.

As shown in FIG. 18F, the dielectric spacer 402 is partially etched back, similar to the operation 118 discussed above. As shown in FIG. 18G, an isolation feature 408 is formed over the signal interconnection 406, similar to the operation 120 discussed above. As shown in FIG. 18H, the semiconductor fins 204 are replaced with an insulator material, similar to the operation 122 discussed above.

Figure 19A:
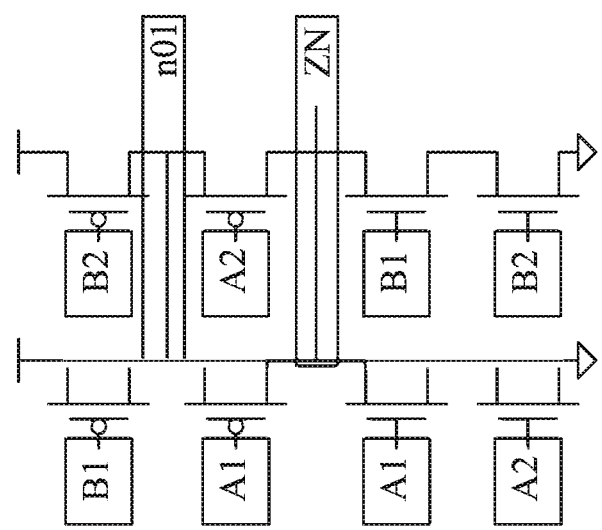
FIG. 19A illustrate a schematic view of a portion of the semiconductor device in FIG. 2A, according to some embodiments.

FIG. 19A illustrates a schematic of an example logic cell 300, which may benefit from aspects of the present disclosure. The logic cell 300 may be included in the device 200. The logic cell 300 implements an AOI (AND-OR-INVERTER) function and includes 4 PMOSFETs and 4 NMOSFETs. The logic cell 300 includes input terminals A1, A2, B1, and B2, an output terminal ZN, and an internal net n01.

Figure 19B:
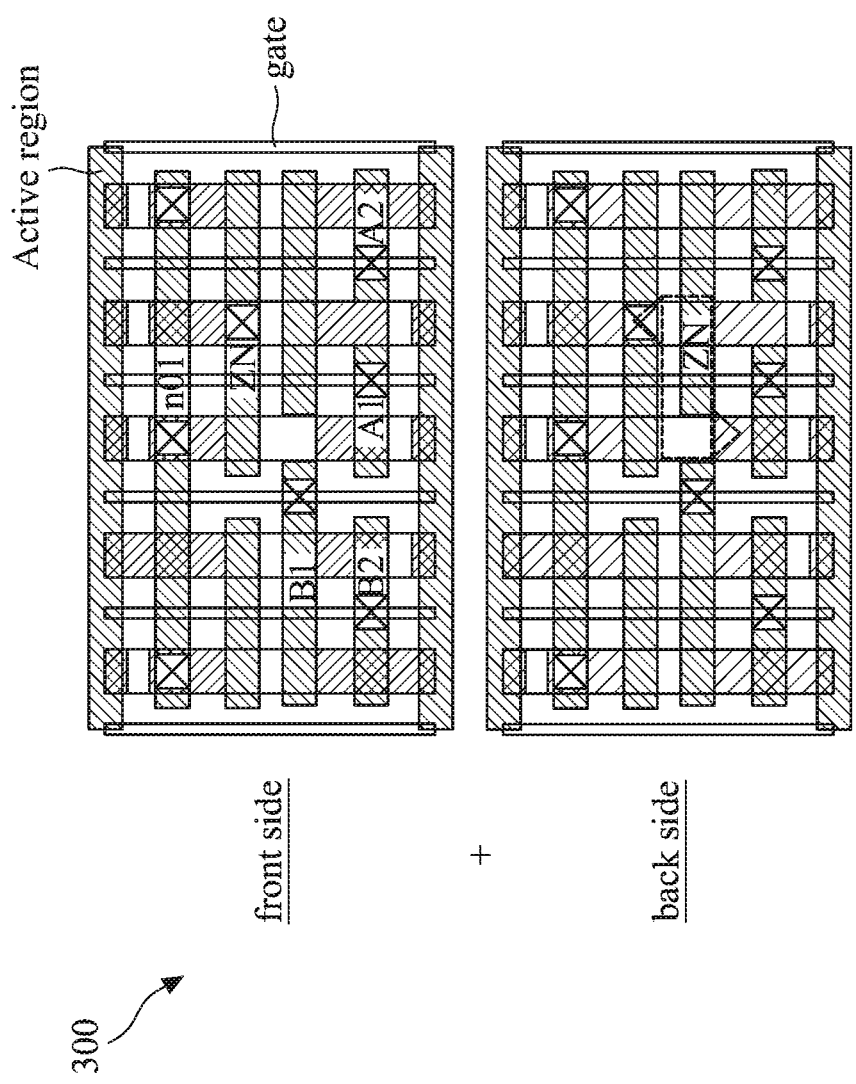
FIGS. 19B and 19C illustrate layout views of the portion of the semiconductor device in FIG. 19A, according to some embodiments.

FIG. 19B illustrates a layout implementation of the logic cell 300 according to the present embodiment. Particularly, the input terminals A1, A2, B1, B2, the internal net n01, and part of the output terminal ZN are implemented as signal interconnections at the frontside of the logic cell 300; while another part of the output terminal ZN is implemented as a signal interconnection at the backside of the logic cell 300, such as the signal interconnection 406 shown in FIGS. 14 and 15. Because part of the output terminal ZN is implemented as a backside signal interconnection, the routing at the frontside of the logic cell 300 is less congested. Particularly, the frontside signal interconnection for ZN does not directly face any of the signal interconnections for the input terminals A1, A2, B1, and B2, thereby reducing the parasitic resistance thereof. In the layout of FIG. 19B, the gates are oriented vertically while the active regions (such as channel regions and S/D regions) are oriented horizontally. The gates and the active regions are implemented at the frontside of the logic cell 300. The logic cell 300 takes up an area that spans 5 gate-to-gate pitches. The frontside signal interconnections are implemented using 4 metal tracks.

Figure 19C:
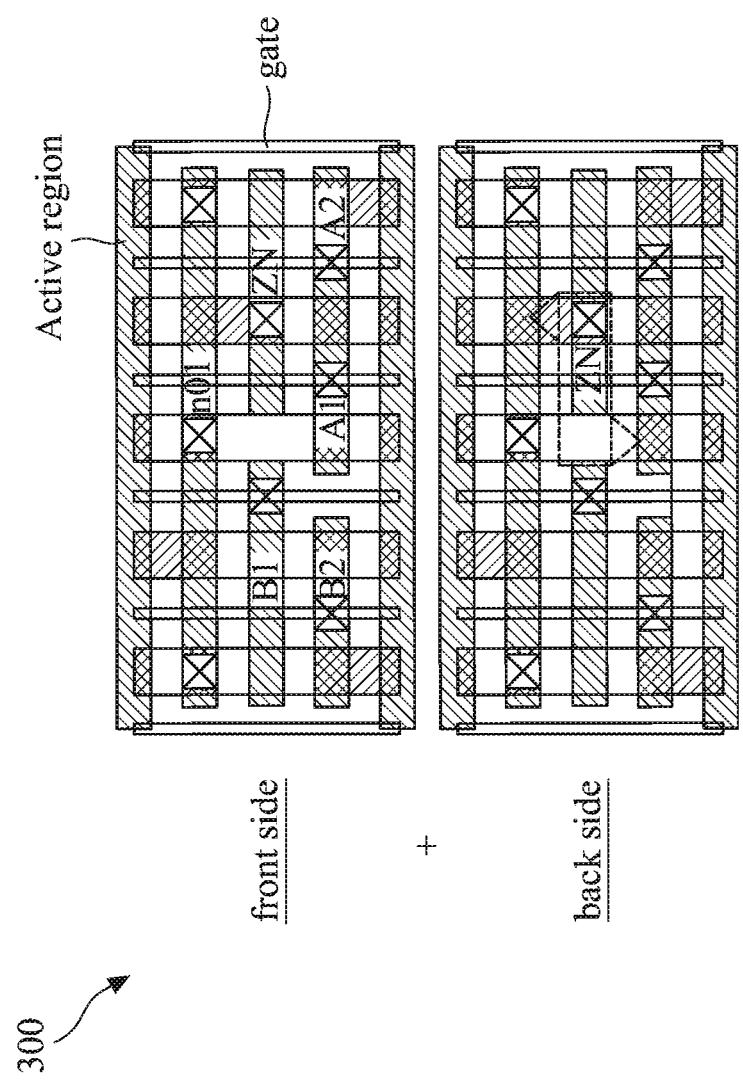

FIG. 19C illustrates another layout implementation of the logic cell 300 according to the present embodiment. Particularly, the input terminals A1, A2, B1, B2, the internal net n01, and part of the output terminal ZN are implemented as signal interconnections at the frontside of the logic cell 300; while another part of the output terminal ZN is implemented as a signal interconnection at the backside of the logic cell 300, such as the signal interconnection 406 shown in FIGS. 14 and 15. In the layout of FIG. 19C, the gates are oriented vertically while the active regions (such as channel regions and S/D regions) are oriented horizontally. The gates and the active regions are implemented at the frontside of the logic cell 300. The logic cell 300 takes up an area that spans 5 gate-to-gate pitches. The frontside signal interconnections are implemented using 3 metal tracks. The implementation in FIG. 19C uses a smaller area of the silicon wafer than the implementation in FIG. 19B. However, the parasitic resistance of the output terminal ZN at the frontside may be higher than that in FIG. 19B.

Although not intended to be limiting, embodiments of the present disclosure provide one or more benefits to semiconductor structures and fabrications. For example, embodiments of the present disclosure provide signal interconnections at the backside of a device and below transistors. The backside signal interconnections can be used for establishing connectivity between an S/D and another S/D, an S/D and a gate, and a gate and another gate. With the backside signal interconnections, the routing at the frontside of the device becomes less congested and higher circuit density can be achieved. Embodiments of the present disclosure can be readily integrated into existing semiconductor manufacturing processes.

In one example aspect, the present disclosure is directed to a semiconductor structure. The semiconductor structure includes a first transistor having a first source/drain (S/D) feature and a first gate; a second transistor having a second S/D feature and a second gate; a multi-layer interconnection disposed over the first and the second transistors; a signal interconnection under the first and the second transistors; and a power rail under the signal interconnection and electrically isolated from the signal interconnection, wherein the signal interconnection electrically connects one of the first S/D feature and the first gate to one of the second S/D feature and the second gate.

In an embodiment, the semiconductor structure further includes a first via under the first transistor and electrically connected to the first S/D feature; and a second via under the second transistor and electrically connected to the second S/D feature, wherein the first and the second vias are isolated from the power rail, and the signal interconnection directly contacts the first via and the second via. In a further embodiment, a bottom surface of the signal interconnection is substantially flat, and a top surface of the signal interconnection has a step profile. In another further embodiment, a first sidewall surface of the signal interconnection directly contacts the first via, and a second sidewall surface of the signal interconnection directly contacts the second via.

In an embodiment of the semiconductor structure, the signal interconnection electrically connects the first gate to the second gate. In a further embodiment, a bottom surface of the signal interconnection is substantially flat, and a top surface of the signal interconnection has two protrusions that directly contact the first gate and the second gate.

In an embodiment, the semiconductor structure further includes a first via under the first transistor and electrically connected to the first S/D feature, wherein the signal interconnection directly contacts the first via and the second gate. In a further embodiment, a bottom surface of the signal interconnection is substantially flat, a sidewall surface of the signal interconnection directly contacts the first via, and a top surface of the signal interconnection directly contacts the gate.

In an embodiment of the semiconductor structure, the signal interconnection is part of a standard logic cell and is routed within boundaries of the standard logic cell. In another embodiment where the first transistor further includes a third S/D feature, the semiconductor structure further includes a third via under the first transistor and electrically connecting the third S/D feature to the power rail.

In another example aspect, the present disclosure is directed to a method that includes providing a structure having first and second transistors over a substrate and a first isolation structure between the first and the second transistors, wherein the first transistor includes a first source/drain (S/D) feature and the second transistor includes a second S/D feature, the structure further having first and second vias connecting to the first and the second S/D features respectively and extending to a backside of the structure. The method further includes partially removing the first isolation structure, thereby exposing a first sidewall surface of the first via and a second sidewall surface of the second via, wherein a first portion of the first isolation structure remains in the structure. The method further includes depositing a metal interconnection on the first portion of the first isolation structure and electrically contacting the first sidewall surface and the second sidewall surface; and forming an isolation feature on the metal interconnection, the first via, and the second via.

In an embodiment, before the forming of the isolation feature, the method further includes etching back the metal interconnection, the first via, and the second via. In another embodiment, the method further includes forming a power rail on the isolation feature.

In an embodiment of the method, the partially removing of the first isolation structure results in a trench, and the first and the second sidewall surfaces are part of sidewalls of the trench. In a further embodiment, before the depositing of the metal interconnection, the method further includes depositing a dielectric spacer on surfaces of the trench and patterning the dielectric spacer to expose the first sidewall surface and the second sidewall surface, wherein the metal interconnection is deposited partially on the dielectric spacer. In a further embodiment, after the depositing of the metal interconnection, the method further includes partially removing the dielectric spacer before the forming of the isolation feature.

In yet another example aspect, the present disclosure is directed to a method that includes providing a structure having first and second transistors wherein the first transistor includes a first source/drain (S/D) feature and the second transistor includes a second S/D feature, the structure further having a multi-layer interconnect over a frontside of the first and the second transistors, a first via disposed on a backside of the first S/D feature, a second via disposed on a backside of the second S/D feature, and a first isolation feature disposed on a backside of the structure and adjacent to the first and the second vias. The method further includes partially removing the first isolation feature, thereby forming a trench at the backside of the structure, wherein the trench exposes a first sidewall surface of the first via and a second sidewall surface of the second via. The method further includes depositing a dielectric spacer on surfaces of the trench; patterning the dielectric spacer to expose the first sidewall surface and the second sidewall surface; depositing one or more metallic materials over a remaining portion of the dielectric spacer and filling the trench; and etching back the one or more metallic materials, the first via, and the second via, wherein a remaining portion of the one or more metallic materials becomes a signal interconnection that electrically connects the first via and the second via.

In an embodiment, after the etching back, the method further includes partially removing the remaining portion of the dielectric spacer. In another embodiment, after the etching back, the method further includes forming a second isolation feature on the signal interconnection, the first via, and the second via. In a further embodiment, the method includes forming a power rail on the second isolation feature and at the backside of the structure.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a first transistor having a first source/drain (S/D) feature and a first gate;
    a second transistor having a second S/D feature and a second gate;
    a multi-layer interconnection disposed over the first and the second transistors;
    a signal interconnection under the first and the second transistors; and
    a power rail under the signal interconnection and electrically isolated from the signal interconnection, wherein the signal interconnection electrically connects one of the first S/D feature and the first gate to one of the second S/D feature and the second gate.

2. The semiconductor structure of claim 1, further comprising:
    a first via under the first transistor and electrically connected to the first S/D feature; and
    a second via under the second transistor and electrically connected to the second S/D feature, wherein the first and the second vias are isolated from the power rail, and the signal interconnection directly contacts the first via and the second via.

3. The semiconductor structure of claim 2, wherein a bottom surface of the signal interconnection is substantially flat, and a top surface of the signal interconnection has a step profile.

4. The semiconductor structure of claim 2, wherein a first sidewall surface of the signal interconnection directly contacts the first via, and a second sidewall surface of the signal interconnection directly contacts the second via.

5. The semiconductor structure of claim 1, wherein the signal interconnection electrically connects the first gate to the second gate.

6. The semiconductor structure of claim 5, wherein a bottom surface of the signal interconnection is substantially flat, and a top surface of the signal interconnection has two protrusions that directly contact the first gate and the second gate.

7. The semiconductor structure of claim 1, further comprising:
    a first via under the first transistor and electrically connected to the first S/D feature, wherein the signal interconnection directly contacts the first via and the second gate.

8. The semiconductor structure of claim 7, wherein a bottom surface of the signal interconnection is substantially flat, a sidewall surface of the signal interconnection directly contacts the first via, and a top surface of the signal interconnection directly contacts the second gate.

9. The semiconductor structure of claim 1, wherein the signal interconnection is part of a standard logic cell and is routed within boundaries of the standard logic cell.

10. The semiconductor structure of claim 1, wherein the first transistor further includes a third S/D feature, further comprising:
    a third via under the first transistor and electrically connecting the third S/D feature to the power rail.

11. A semiconductor structure, comprising:
    a first transistor having a first source/drain (S/D) feature and a first gate;
    a second transistor having a second S/D feature and a second gate;
    a signal interconnection under the first and the second transistors;
    an isolation feature under the signal interconnection; and
    a power rail under the isolation feature,
    wherein the signal interconnection electrically connects the first S/D feature to the second S/D feature and the isolation feature electrically isolates the signal interconnection from the power rail.

12. The semiconductor structure of claim 11, further comprising:
    a first via vertically between the first S/D feature and the isolation feature; and
    a second via vertically between the second S/D feature and the isolation feature, and the signal interconnection directly contacts the first via and the second via.

13. The semiconductor structure of claim 11, wherein a bottom surface of the signal interconnection is substantially flat, and a top surface of the signal interconnection has a step profile.

14. The semiconductor structure of claim 11, further comprising:
    a third transistor having a third S/D feature and a third gate; and
    a dielectric spacer isolating the third S/D feature from the signal interconnection,
    wherein the third S/D feature is electrically connected to the power rail.

15. The semiconductor structure of claim 14, further comprising:
a third via vertically between the third S/D feature and the power rail to electrically connect the third S/D feature to the power rail, wherein the third via directly contacts the third S/D feature and the power rail.

16. The semiconductor structure of claim 15, further comprising:
a first via vertically between the first S/D feature and the isolation feature,
wherein a lateral portion of the isolation feature is directly between and contacting the first via and the third via, and the lateral portion isolates the first via from the third via.

17. A semiconductor structure, comprising:
a substrate;
a first transistor disposed over the substrate, the first transistor having a first source/drain (S/D) feature and a first gate;
a second transistor disposed over the substrate, the second transistor having a second S/D feature and a second gate;
a signal interconnection under the first and the substrate;
an isolation feature under the signal interconnection; and
a power rail under the isolation feature,
wherein the signal interconnection electrically connects the first gate to the second gate and the isolation feature electrically isolates the signal interconnection from the power rail.

18. The semiconductor structure of claim 17, wherein a bottom surface of the signal interconnection is substantially flat, and a top surface of the signal interconnection has two protrusions that directly contact the first gate and the second gate.

19. The semiconductor structure of claim 17, further comprising:
a first via vertically between the first S/D feature and the power rail to electrically connect the first S/D feature to the power rail, wherein the first via directly contacts the first S/D feature and the power rail; and
a second via vertically between the second S/D feature and the power rail to electrically connect the second S/D feature to the power rail, wherein the second via directly contacts the second S/D feature and the power rail.

20. The semiconductor structure of claim 19, further comprising:
a dielectric spacer isolating the first and second S/D vias from the signal interconnection.

* * * * *